(12) United States Patent
Akashi et al.

(10) Patent No.: US 8,368,196 B2
(45) Date of Patent: Feb. 5, 2013

(54) MICRO DEVICE HAVING A MOVABLE STRUCTURE

(75) Inventors: Teruhisa Akashi, Nagoya (JP); Hirofumi Funabashi, Nagoya (JP); Motohiro Fujiyoshi, Sato (JP); Yutaka Nonomura, Nagoya (JP)

(73) Assignee: Kabushiki Kaisha Toyota Chuo Kenkyusho, Aichi (JP)

( * ) Notice: Subject to any disclaimer, the term of this patent is extended or adjusted under 35 U.S.C. 154(b) by 263 days.

(21) Appl. No.: 12/710,571

(22) Filed: Feb. 23, 2010

(65) Prior Publication Data

US 2010/0219716 A1  Sep. 2, 2010

(30) Foreign Application Priority Data

Feb. 27, 2009  (JP) .................................. 2009-046414

(51) Int. Cl.
*H01L 23/02*  (2006.01)

(52) U.S. Cl. ................. 257/686; 257/737; 257/E21.585; 438/109; 438/614

(58) Field of Classification Search ................... 257/777, 257/778, 779, 780, 781, 782, 783, 785, 678, 257/686, 723, E21.585, 736, 737, 738; 438/108, 438/109, 110, 118, 119, 612, 613, 614
See application file for complete search history.

(56) References Cited

U.S. PATENT DOCUMENTS

| | | | |
|---|---|---|---|
| 5,367,429 A | 11/1994 | Tsuchitani et al. | |
| 5,824,608 A | 10/1998 | Gotoh et al. | |
| 6,065,341 A | 5/2000 | Ishio et al. | |
| 7,501,835 B2 | 3/2009 | Fujiyoshi et al. | |
| 2001/0025530 A1 | 10/2001 | Sakai et al. | |
| 2003/0183947 A1* | 10/2003 | Ohuchi | 257/778 |
| 2004/0187592 A1 | 9/2004 | Sugiura | |
| 2006/0170112 A1* | 8/2006 | Tanaka et al. | 257/777 |
| 2007/0007639 A1* | 1/2007 | Fukazawa | 257/686 |
| 2007/0085189 A1* | 4/2007 | Sunohara et al. | 257/686 |
| 2007/0108627 A1* | 5/2007 | Kozaka et al. | 257/778 |
| 2007/0148817 A1* | 6/2007 | Williams et al. | 438/106 |
| 2007/0218630 A1 | 9/2007 | Yamaguchi et al. | |
| 2008/0030968 A1* | 2/2008 | Mashino | 361/767 |
| 2008/0117394 A1* | 5/2008 | Owa et al. | 355/30 |

FOREIGN PATENT DOCUMENTS

| | | |
|---|---|---|
| JP | A-05-172846 | 7/1993 |
| JP | A-09-018015 | 1/1997 |
| JP | A-10-079520 | 3/1998 |
| JP | A-11-230985 | 8/1999 |

(Continued)

OTHER PUBLICATIONS

Japanese Office Action issued in Japanese Patent Application No. 2009-046414 dated Aug. 9, 2011 (with translation).

*Primary Examiner* — Ha Tran T Nguyen
*Assistant Examiner* — Thanh Y Tran
(74) *Attorney, Agent, or Firm* — Oliff & Berridge, PLC

(57) ABSTRACT

The micro device includes a support substrate, and a movable structure configured to move with respect to the support substrate. At least one of the support substrate and the movable structure is provided with at least one protrusion protruding towards the other of the support substrate and the movable structure. Further, a base portion extending into the one of the support substrate and the movable structure is provided integrally with the at least one protrusion. With this configuration, the protrusion is securely held by the base portion, and the detachment of the protrusion can therefore be prevented even after repeated collisions between the support substrate and the movable structure via the protrusion.

23 Claims, 27 Drawing Sheets

FOREIGN PATENT DOCUMENTS

| | | |
|---|---|---|
| JP | A-11-340477 | 12/1999 |
| JP | A-2000-310648 | 11/2000 |
| JP | A-2000-349065 | 12/2000 |
| JP | A-2001-330623 | 11/2001 |
| JP | A-2002-148278 | 5/2002 |
| JP | A-2002-160363 | 6/2002 |
| JP | A-2002-257847 | 9/2002 |
| JP | A-2004-294401 | 10/2004 |
| JP | A-2007-268704 | 10/2007 |

* cited by examiner

A-A' Cross-Section

B-B' Cross-Section

B-B' Cross-Section

Process 1

B-B' Cross-Section

Process 1

C-C' Cross-Section

B-B' Cross-Section

C-C' Cross-Section

Process3

B-B' Cross-Section

Process3

C-C' Cross-Section

Process4

B-B' Cross-Section

Process4

C-C' Cross-Section

B-B' Cross-Section

C-C' Cross-Section

B-B' Cross-Section

C-C' Cross-Section

B-B' Cross-Section

C-C' Cross-Section

B-B' Cross-Section

C-C' Cross-Section

E-E' Cross-Section

MICRO DEVICE HAVING A MOVABLE STRUCTURE

CROSS-REFERENCE TO RELATED APPLICATIONS

This application claims priority to Japanese Patent Application No. 2009-046414 filed on Feb. 27, 2009, the contents of which are hereby incorporated by reference into the present application.

TECHNICAL FIELD

The present invention relates to a micro device having a movable structure.

DESCRIPTION OF RELATED ART

There are known micro devices having a movable structure. This type of micro device is called MEMS (micro-electro-mechanical systems) or a micro machine, and is manufactured from an SOI substrate or another such layer-forming material, using semiconductor element manufacturing technology. With the micro device having the movable structure, the movable structure must be prevented from sticking to its support substrate, and techniques for preventing the movable structure from sticking to the support substrate have been disclosed e.g. in the following publications.

Japanese Patent Application Publication No. 2000-349065 discloses an oscillation detector. This oscillation detector comprises a substrate and a movable structure that is opposing the substrate across a space (gap). The movable structure is supported so as to move with respect to the substrate. With this oscillation detector, the surface of the substrate that is opposing the movable structure is roughened by etching.

Japanese Patent Application Publication No. 2007-268704 discloses a semiconductor device. This semiconductor device comprises a first structure layer and a second structure layer that is opposing the first structure layer across a space. The second structure layer serves as the movable structure supported so as to move with respect to the first structure layer. With this semiconductor device, the opposing surfaces of the first structure layer and the second structure layer are roughened with a laser to different degrees of roughness with respect to each other.

Japanese Patent Application Publication No. H11-340477 discloses an acceleration sensor. This acceleration sensor comprises a fixed electrode and a movable electrode that is opposing the fixed electrode across a space. The movable electrode serves as the movable structure supported so as to move with respect to the fixed electrode. With this acceleration sensor, texturing in which the width of depressions is at least 0.01 μm and no more than 0.1 μm is formed by anodization in at least one of the opposing surfaces of the fixed electrode and movable electrode.

Japanese Patent Application Publication No. 2002-160363 discloses an inkjet head. This inkjet head comprises a fixed electrode and a movable electrode that is opposing the fixed electrode across a space. The movable electrode serves as the movable structure supported so as to move with respect to the fixed electrode. With this inkjet head, a plurality of protrusions having an electrical insulation property is provided to at least one of the mutually opposing surfaces of the movable electrode and the fixed electrode.

SUMMARY

If the opposing surfaces of a movable structure and a support substrate are roughened, the contact surface area when the movable structure and the support substrate come into contact with each other can be kept relatively small. Therefore, the movable structure and the support substrate can be prevented from sticking together. Nevertheless, repeated contact between the movable structure and the support substrate gradually smoothes out the roughened surfaces, and as a result the movable structure and the support substrate may end up sticking together. In contrast, it is believed that if protrusions are formed on the opposing surfaces of the movable structure and the support substrate, as long as the protrusions are not worn down completely, the movable structure and the support substrate can be prevented from sticking together over an extended period. However, repeated contact between the movable structure and the support substrate can cause the protrusions themselves to detach from the movable structure or the support substrate, and as a result the movable structure and the support substrate may end up sticking together. As can be seen from the above, the sticking together of a movable structure and a support substrate is a problem that cannot be prevented over a long period with the prior art discussed above.

It is an object of the present teachings to disclose a technique for preventing a movable structure and a support substrate from sticking together over an extended period.

In one aspect of the present teachings, a micro device comprises a support substrate and a movable structure configured to move with respect to the substrate. At least one of the support substrate and the movable structure is provided with at least one protrusion protruding towards another of the support substrate and the movable structure. A base portion extending into the one of the support substrate and the movable structure is provided integrally with the at least one protrusion.

With this micro device, because the protrusion functions as a stopper, it prohibits direct contact between the movable structure and the support substrate. Consequently, the movable structure and the support substrate are prevented from sticking together. The protrusion is securely held by the base portion, which is embedded in the support substrate or the movable structure. Therefore, even if collisions are repeated between the support substrate and the movable structure via the protrusion, the protrusion will not be detached. This micro device provides a technique with which the support substrate and the movable structure can be prevented from sticking together over an extended period.

This Specification also discloses a method for manufacturing a micro device. With this method, a micro device that comprises a movable structure that is supported to move with respect to a substrate, and that is provided with at least one protrusion on at least one of the substrate and the movable structure can be manufactured. This method comprises preparing a laminate material in which a bulk layer is laminated to a substrate with a sacrificial layer disposed therebetween, forming a hole reaching the sacrificial layer in at least one of the substrate and the bulk layer, etching part of the sacrificial layer through the hole to form a cavity that continues from the hole in the sacrificial layer, filling the interior of the hole and the cavity with the material that forms the protrusion, working the bulk layer into the shape of the movable structure, and etching the sacrificial layer between the substrate and the movable structure.

As with the above-mentioned manufacturing method, the protrusion can be formed on the surface of the support substrate or the movable structure by filling the cavity formed in the sacrificial layer with the material that forms the protrusion, through the hole formed in the support substrate or the movable structure that is contiguous to the cavity. If the hole formed in the support substrate or the movable structure is also filled at this time with the material that forms the protrusion, then the base portion extending into the support substrate or the movable structure can be formed integrally with the protrusion.

With the above method, the protrusion that prevents contact between the movable structure and the support substrate can be formed ahead of time, before the sacrificial layer is removed from between the movable structure and the support substrate. When the sacrificial layer is removed from between the movable structure and the support substrate, the movable structure and the support substrate end up being opposite each other across a space, in a state in which the two can come into contact with each other. If the protrusion has already been formed between the movable structure and the support substrate at this point, then direct contact therebetween is prevented. With this manufacturing method, the movable structure and the support substrate can be prevented from sticking together from the stage at which the micro device is manufactured.

With the above method, the cavity is preferably formed by isotropic etching. When the sacrificial layer is isotropically etched through the hole, the etching of the sacrificial layer proceeds radially outward from the position of the hole. Therefore, a substantially hemispherical cavity is formed in the sacrificial layer. If the shape of the cavity is substantially hemispherical, then the shape of the protrusion formed later will also be substantially hemispherical. In this case, the surface at the distal end of the protrusion is a curved face, and at the position where the protrusion and the base portion are connected, the cross sectional area of the protrusion is smaller than the cross sectional area of the base portion. Specifically, the protrusion and base portion that are favorable as described above can have a relatively simple configuration.

With the micro device of the present teachings, the support substrate and the movable structure are prevented from sticking together over an extended period. Furthermore, with the manufacturing method disclosed herein, the support substrate and the movable structure are prevented from sticking together from the stage of the micro device manufacturing process.

BRIEF DESCRIPTION OF THE DRAWINGS

FIG. 7a shows the B-B' cross section, and FIG. 7b the C-C' cross section.

FIG. 8a shows the B-B' cross section, and FIG. 8b the C-C' cross section.

FIG. 9a shows the B-B' cross section, and FIG. 9b the C-C' cross section.

FIG. 10a shows the B-B' cross section, and FIG. 10b the C-C' cross section.

FIG. 11a shows the B-B' cross section, and FIG. 11b the C-C' cross section.

FIG. 12a shows the B-B' cross section, and FIG. 12b the C-C' cross section.

FIG. 13a shows the B-B' cross section, and FIG. 13b the C-C' cross section.

FIG. 14a shows the B-B' cross section, and FIG. 14b the C-C' cross section.

FIG. 15a shows the B-B' cross section, and FIG. 15b the C-C' cross section;

DETAILED DESCRIPTION

Figure 1:
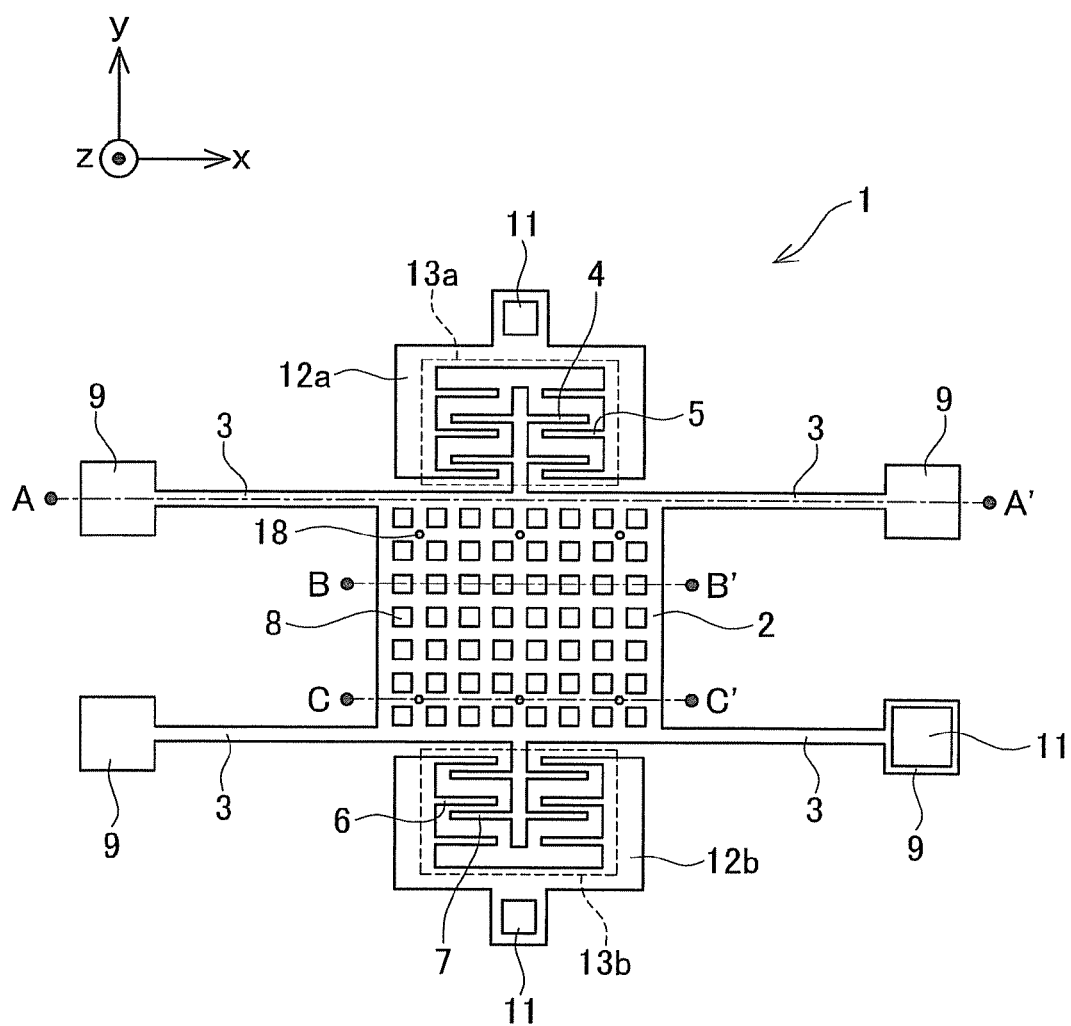
FIG. 1 is a plan view of a biaxial acceleration sensor in Embodiment 1.

The present teachings can be applied to an acceleration sensor or angular rate sensor, which are types of a micro device. The acceleration sensor or angular rate sensor comprises a support substrate and a movable mass that is opposite the support substrate across a space (gap), and is supported so as to move with respect to the support substrate. In this case, at least one of the movable mass and the support substrate may have the protrusion and base portion pertaining to the present teachings. Consequently, the support substrate and the movable mass can be prevented from sticking together over an extended period.

The present teachings can also be applied to a mirror array device, which is another type of the micro device. The mirror array device comprises the support substrate and a movable mirror that is opposite the support substrate across a space, and is supported so as to move with respect to the support substrate. In this case, at least one of the movable mirror and the support substrate may have the protrusion and base portion pertaining to the present teachings. Consequently, the support substrate and the movable mirror can be prevented from sticking together over an extended period.

The present teachings is not limited to the above examples, and can be applied to other kinds of micro devices formed from semiconductor materials. Alternatively, the protrusion and the base portion pertaining to the present teachings can be provided to a micro device formed from a material other than a semiconductor material.

In one embodiment of the present teachings, the surface at the distal end of protrusion is preferably a curved face. With this constitution, when the movable structure and the support substrate collide with the protrusion in between, stress produced in the protrusion or in the movable structure or support substrate colliding with the protrusion can be kept low. This prevents damage to the protrusion or to the movable structure or support substrate, and also prevents erroneous operation caused by the generation of debris.

In one embodiment of the present teachings, it is preferable that the base portion extends from the bottom face of the protrusion. It is also preferable that the bottom face of the protrusion is larger in surface area than a cross-sectional surface of the base portion and has a contact range over which the protrusion comes into contact with the one surface of the substrate and the movable structure. With this constitution, the protrusion is not only held by the base portion, but is also joined to the surface of the support substrate or the movable structure. This more reliably prevents the protrusion from detaching.

In one embodiment of the present teachings, it is preferable that the protrusion and its base portion are formed from polysilicon. If polysilicon is used, a tiny protrusion and base portion can be formed with high strength. Also, since polysilicon has high electrical resistivity, it prevents short circuiting between the movable structure and the support substrate.

Embodiment 1

Figure 2:
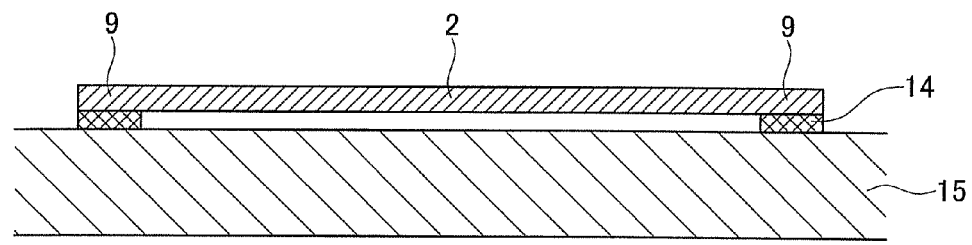
FIG. 2 is an A-A' cross section of the biaxial acceleration sensor shown in FIG. 1.
Figure 3:
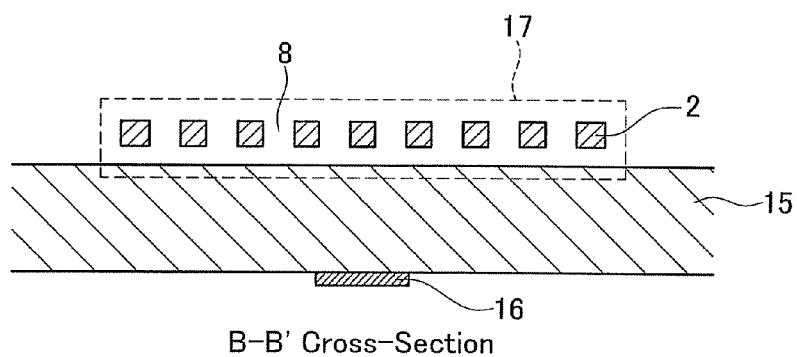
FIG. 3 is a B-B' cross section of the biaxial acceleration sensor shown in FIG. 1.
Figure 4:
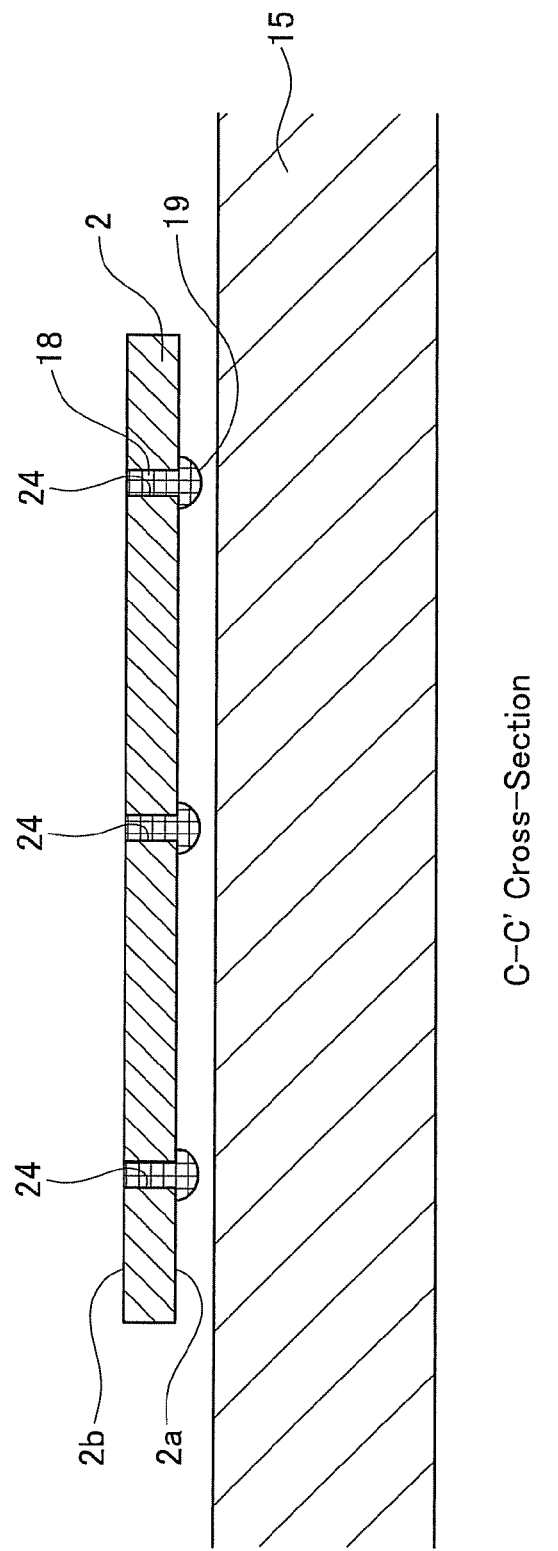
FIG. 4 is a C-C' cross section of the biaxial acceleration sensor shown in FIG. 1.

FIG. 1 is a plan view of the configuration of a biaxial acceleration sensor 1 in Embodiment 1. FIG. 2 is an a-a' cross section of the biaxial acceleration sensor 1 shown in FIG. 1. FIG. 3 is a B-B' cross section of the biaxial acceleration sensor 1 shown in FIG. 1. FIG. 4 is a C-C' cross section of the biaxial acceleration sensor 1 shown in FIG. 1. The biaxial acceleration sensor 1 is a micro device capable of detecting acceleration applied in the y axis direction, and acceleration applied in the z axis direction. The biaxial acceleration sensor 1 is a type of semiconductor device manufactured from a semiconductor substrate. More precisely, it is manufactured from an SOI (silicon-on-insulator) substrate comprising two silicon substrates laminated on either sides of an insulating layer.

As shown in FIGS. 1, 2, and 3, the biaxial acceleration sensor 1 comprises a support substrate 15, four anchors 9 that are fixed to the top face of the support substrate 15 with an insulating layer 14 in between, a movable mass 2 that is opposing the support substrate 15 across a space (gap) and that is positioned in the approximate center with respect to the four anchors 9, and four support arms 3 extending from the movable mass 2 to the respective anchors 9. The support substrate 15 is formed from single crystal silicon. The single crystal silicon that forms the support substrate 15 is electroconductive because it has been doped with conductive impurities. Similarly, the anchors 9, the movable mass 2, and the support 3 are formed integrally by working a bulk substrate of single crystal silicon. The single crystal silicon that forms the anchors 9, the movable mass 2, and the support arms 3 is also electroconductive because it has been doped with conductive impurities. However, the single crystal silicon that forms the support substrate 15 is electrically insulated from the single crystal silicon that forms the anchors 9, the movable mass 2, and the support arms 3 by the insulating layer 14.

The support arms 3 extend parallel to the x axis direction between the movable mass 2 and the respective anchors 9. Also, the support arms 3 each extends substantially parallel to the support substrate 15, and is opposing the support substrate 15 across an intervening space. Specifically, each of the support arms 3 is separated from the support substrate 15, and can be elastically deformed. Consequently, the movable mass 2 is supported to as to move in the y axis direction and the z axis direction with respect to the support substrate 15. Therefore, when acceleration in the y axis direction is applied to the biaxial acceleration sensor 1, the movable mass 2 is moved in the y axis direction with respect to the support substrate 15, and when acceleration in the z axis direction is applied to the biaxial acceleration sensor 1, the movable mass 2 is moved in the z axis direction with respect to the support substrate 15. Here, the movable mass 2 is moved in the opposite direction from the direction in which the acceleration is applied.

A plurality of rectangular holes 8 laid out in a matrix is formed in the movable mass 2. These rectangular holes 8 are provided in order to etch the insulating layer 14 (the sacrificial layer) in the process of manufacturing the biaxial acceleration sensor 1. There are no particular restrictions on the number, size, and layout of the rectangular holes 8 formed in the movable mass 2, and can be chosen as appropriate.

As shown in FIG. 1, the movable mass 2 is provided with a plurality of first movable comb electrodes 4 and a plurality of second movable comb electrodes 7. The plurality of first movable comb electrodes 4 is provided on the end face of the movable mass 2 on the y axis positive direction side, and the plurality of second movable comb electrodes 7 is provided on the end face of the movable mass 2 on the y axis negative direction side. The first movable comb electrodes 4 and the second movable comb electrodes 7 are formed integrally with the movable mass 2 from conductive single crystal silicon. Each of the first movable comb electrodes 4 and the second movable comb electrodes 7 extends in the x axis direction. Meanwhile, a first fixed electrode 12a and a second fixed electrode 12b are provided to the support substrate 15. The first fixed electrode 12a and the second fixed electrode 12b are formed from impurity-doped single crystal silicon, and have good conductivity. The first fixed electrode 12a and the second fixed electrode 12b are fixed to the support substrate 15 with the insulating layer 14 in between, and are electrically insulated from the support substrate 15.

The first fixed electrode 12a is positioned in the y axis positive direction with respect to the movable mass 2. A plurality of first fixed comb electrodes 5 is formed on the first fixed electrode 12a. The first fixed comb electrodes 5 each extends in the x axis direction parallel to the first movable comb electrodes 4 of the movable mass 2, and are opposing the first movable comb electrodes 4 in the y axis direction. The second fixed electrode 12b is positioned in the y axis negative direction with respect to the movable mass 2. A plurality of second fixed comb electrodes 6 is formed o the second fixed electrode 12b. The second fixed comb electrodes 6 each extends in the x axis direction parallel to the second movable comb electrodes 7 of the movable mass 2, and are opposing the second movable comb electrodes 7 in the y axis direction.

The plurality of first movable comb electrodes 4 and the plurality of first fixed comb electrodes 5 constitute a first detecting capacitor 13a for detecting acceleration in the y axis direction. Similarly, the plurality of second movable comb electrodes 7 and the plurality of second fixed comb electrodes 6 constitute a second detecting capacitor 13b for detecting acceleration in the y axis direction. The electrostatic capacitance of the first detecting capacitor 13a and that of the second detecting capacitor 13b vary according to the acceleration applied in the y axis direction. Therefore, the acceleration applied in the y axis direction can be measured by measuring the electrostatic capacitance of the first detecting capacitor 13a and that of the second detecting capacitor 13b. The electrostatic capacitances of the first detecting capacitor 13a and the second detecting capacitor 13b can be individually measured by three electrode pads 11 provided on the anchor 9, the first fixed electrode 12a, and the second fixed electrode 12b respectively.

The electrode pads 11 here can be formed from a metal material, examples of which may include a single metal material such as aluminum; a mixed material of aluminum, silicon, and copper; a laminate material composed of chromium, nickel, and gold; and a laminate material composed of titanium, platinum, and gold.

Figure 5:
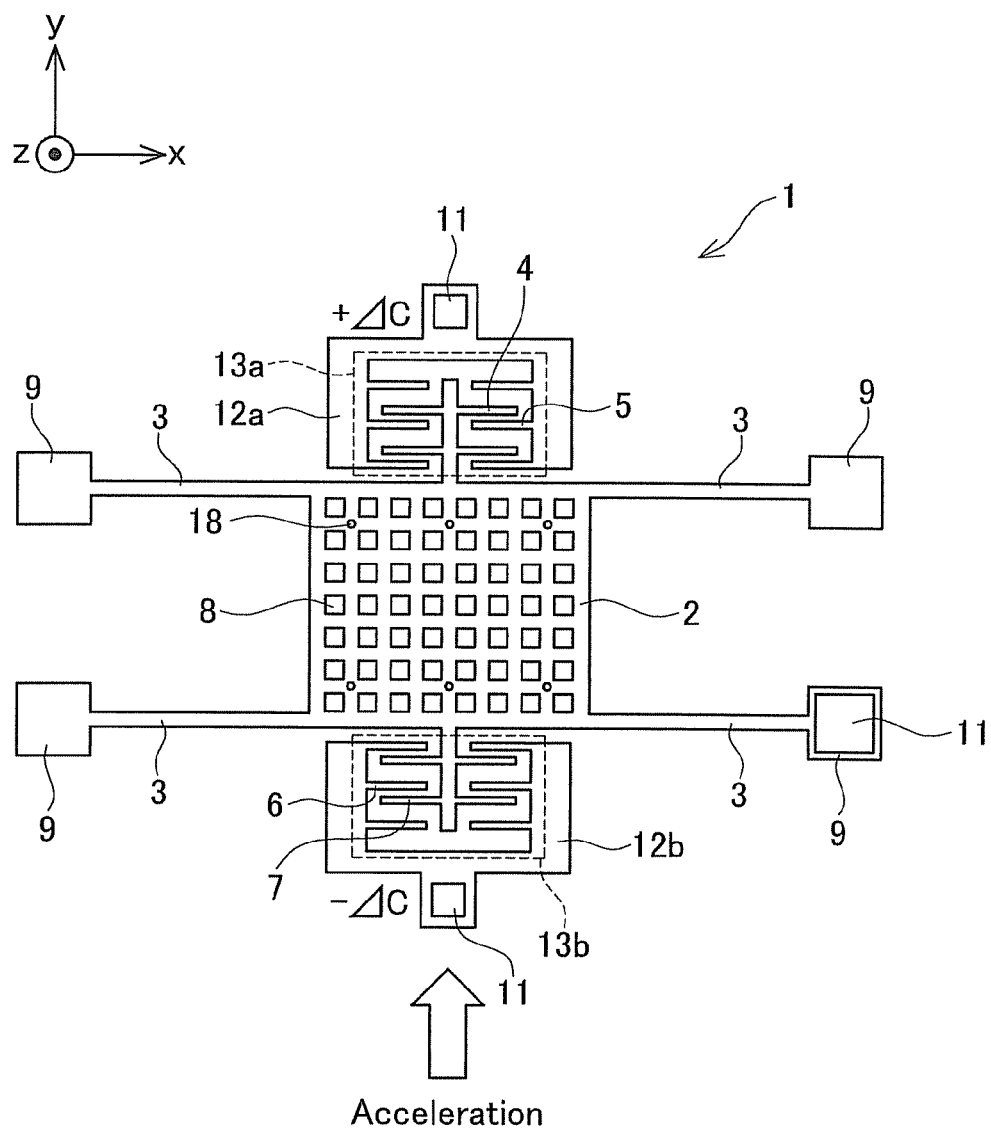
FIG. 5 shows how the biaxial acceleration sensor detects acceleration in the y axis direction.

An example of detecting acceleration in the y axis direction will be described with reference to FIG. 5. As shown in FIG. 5, when acceleration in the y axis positive direction is applied to the biaxial acceleration sensor 1, the movable mass 2 is moved in the y axis negative direction with respect to the support substrate 15. When the movable mass 2 is moved in the y axis negative direction with respect to the support substrate 15, the space between the first movable comb electrodes 4 and the first fixed comb electrodes 5 becomes narrower, and as a result thereof, the electrostatic capacitance of the first detecting capacitor 13a increases by $+\Delta C$. Meanwhile, the space between the second movable comb electrodes 7 and the second fixed comb electrodes 6 becomes wider, and as a result thereof, the electrostatic capacitance of the second detecting capacitor 13b decreases by $-\Delta C$. If the changes $+\Delta C$ and $-\Delta C$ in each electrostatic capacitance are subjected to differential amplification, a positive change $+\Delta C \times 2$ can be obtained overall. The acceleration applied in the y axis positive direction can be accurately measured on the basis of this positive change $+\Delta C \times 2$.

On the other hand, when acceleration in the y axis negative direction is applied to the biaxial acceleration sensor 1, the electrostatic capacitance of the first detecting capacitor 13a decreases by $-\Delta C$, and the electrostatic capacitance of the second detecting capacitor 13b increases by $+\Delta C$. In this case, if the changes $-\Delta C$ and $+\Delta C$ in each electrostatic capacitance are subjected to differential amplification, a negative change $-\Delta C \times 2$ can be obtained overall. The acceleration applied in the y axis negative direction can be accurately measured on the basis of this negative change $-\Delta C \times 2$.

As shown in FIG. 3, the movable mass 2 and the support substrate 15 are opposite each other in the z axis direction across a space, and constitute a third detecting capacitor 17 for detecting acceleration in the z axis direction. The electrostatic capacitance of the third detecting capacitor 17 varies according to the acceleration applied in the z axis direction. Therefore, the acceleration applied in the z axis direction can be measured by measuring the electrostatic capacitance of the third detecting capacitor 17. The electrostatic capacitance of the third detecting capacitor 17 can be measured by the electrode pad 11 provided on the anchor 9, and an electrode film 16 formed on the lower face of the support substrate 15.

Figure 6:
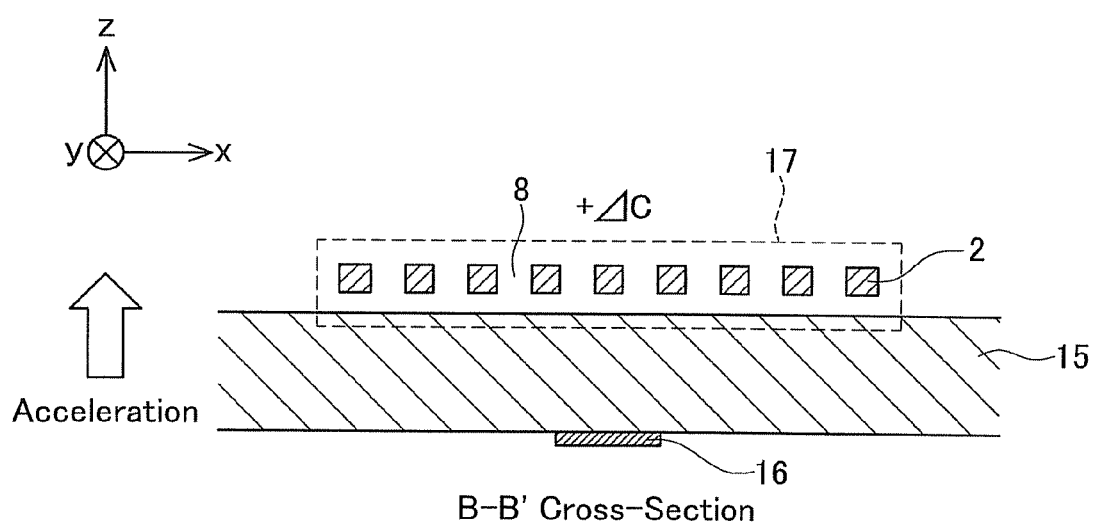
FIG. 6 shows how the biaxial acceleration sensor detects acceleration in the z axis direction, in the B-B' cross section.

An example of detecting acceleration in the z axis direction will be described with reference to FIG. 6. As shown in FIG. 6, when acceleration in the z axis positive direction is applied to the biaxial acceleration sensor 1, the movable mass 2 is moved in the z axis negative direction with respect to the support substrate 15. When the movable mass 2 is moved in the z axis negative direction with respect to the support substrate 15, the space between the movable mass 2 and the support substrate 15 becomes narrower, and as a result thereof, the electrostatic capacitance of the third detecting capacitor 17 increases by $+\Delta C$. The acceleration applied in the z axis positive direction can be accurately measured on the basis of the detected increase $+\Delta C$ in the electrostatic capacitance.

On the other hand, when acceleration in the z axis negative direction is applied to the biaxial acceleration sensor 1, the electrostatic capacitance of the third detecting capacitor 17 decreases by $-\Delta C$. Therefore, the acceleration applied in the z axis negative direction can also be accurately measured on the basis of the detected decrease $-\Delta C$ in the electrostatic capacitance.

As shown in FIG. 4, a plurality of protrusions 19 is formed on the lower face 2a of the movable mass 2 opposite the support substrate 15. These protrusions 19 prohibit the movable mass 2 and the support substrate 15 from coming into direct contact, and prevent the movable mass 2 and the support substrate 15 from sticking together. A base portion 18 is integrally formed on each of the protrusions 19. The base portions 18 extend from the bottom face of the protrusions 19 into through-holes 24 formed in the movable mass 2, and the upper ends thereof are exposed on the upper face 2b of the movable mass 2. Thus, each of the protrusions 19 is provided with the base portion 18 embedded in the movable mass 2. The protrusions 19 are each securely held by the base portion 18, and thereby prevented from coming loose or detached from the movable mass 2.

As shown in FIG. 4, the protrusions 19 have a shape that is substantially hemispherical, and the surface thereof is curved in a convex shape toward the support substrate 15. If the surface is curved at least at the distal ends of the protrusions 19, then when the support substrate 15 and the movable mass 2 collide with the protrusions 19 in between, less stress will be produced in the support substrate 15 and the protrusions 19. Consequently, damage to the protrusions 19 and the support substrate 15 is prevented, and erroneous operation caused by the generation of debris, etc., can also be prevented.

As to the connecting position of the protrusion 19 and its corresponding base portion 18 (the position coinciding with the lower face 2a of the movable mass 2), the bottom face of the protrusion 19 is larger than the cross section of the base portion 18. Because of this, a part of the bottom face of the protrusion 19 comes into contact with the lower face 2a of the movable mass 2, and this contact area surrounds the area where the base portion 18 is connected. With this structure, the protrusion 19 is not merely held by the base portion 18, but is also joined to the lower face 2a of the movable mass 2. Consequently, detachment of the movable mass 2 is effectively prevented.

The protrusions 19 and the base portions 18 in this embodiment are formed from polysilicon, although the material of the protrusions 19 and the base portions 18 is not limited thereto. Examples of other materials may include a mixture of silicon nitride and polysilicon, and metal materials. When a metal material is used, its surface should be oxidized to ensure electrical insulation. These materials can also be used to obtain protrusions 19 that are securely held by integrally formed base portions 18.

Next, the process of manufacturing the biaxial acceleration sensor 1 will be described through reference to FIGS. 7 to 15. FIGS. 7 to 15 show the states in processes 1 to 9 of the biaxial acceleration sensor 1 manufacturing process. In each of FIGS. 7 to 15, (a) shows the state in a B-B' cross section in FIG. 1, and (b) shows the state in a C-C' cross section in FIG. 1.

First, in this manufacturing process, the biaxial acceleration sensor 1 is manufactured from an SOI (silicon-on-insulator) substrate. An SOI substrate is a laminate material in which a bulk substrate 20 of single crystal silicon is laminated to a support substrate 15 of single crystal silicon with an insulating layer 14 of silicon oxide interposed between them. The support substrate 15 and the bulk substrate 20 are doped with a conductive impurity and are therefore conductive. The insulating layer 14 electrically insulates the support substrate 15 from the bulk substrate 20.

Figure 7A:
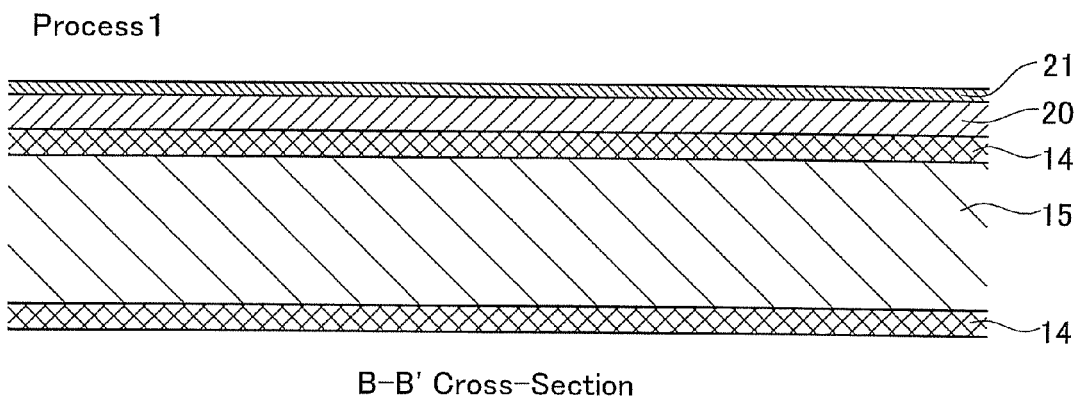
FIGS. 7a and 7b show process 1 of the process of manufacturing the biaxial acceleration sensor, and in particular.
Figure 7B:
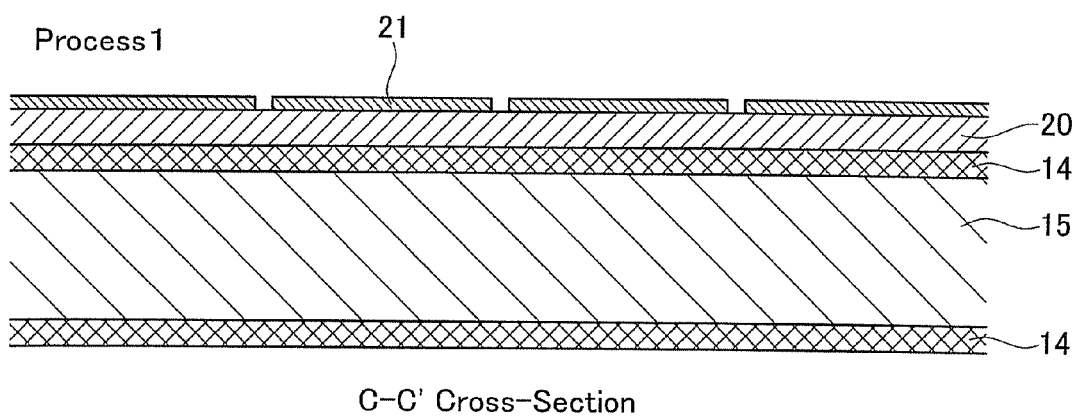

As shown in FIGS. 7a and 7b, in process 1, a first resist 21 is formed in order to form through-holes 24 in the bulk substrate 20. Openings corresponding to the position and shape of the through-holes 24 are formed by photolithography in the first resist 21. The shape of the through-holes 24 here is circular, but the shape of the through-holes 24 may instead be rectangular or elliptical.

Figure 8A:
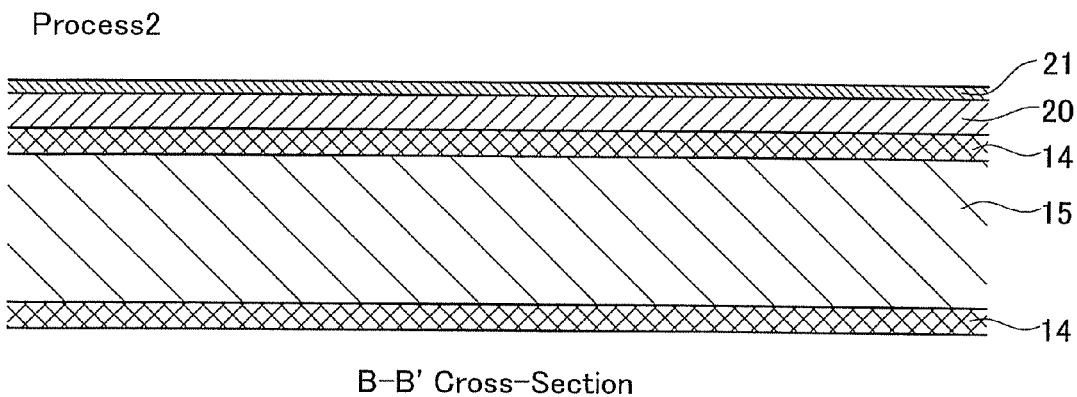
FIGS. 8a and 8b show process 2 of the process of manufacturing the biaxial acceleration sensor, and in particular.
Figure 8B:
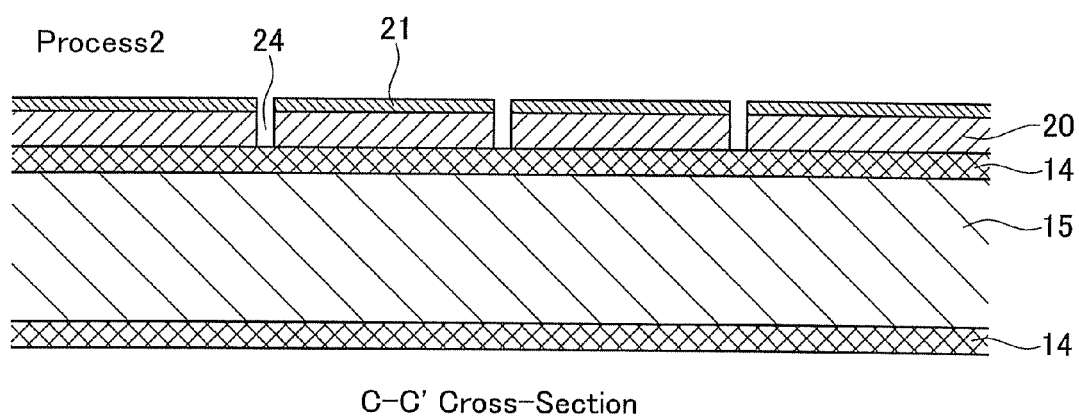

As shown in FIGS. 8a and 8b, in process 2, the through-holes 24 are formed in the bulk substrate 20 by DRIE (deep reactive ion etching) using the first resist 21 as a mask. The through-holes 24 are formed so as to reach the insulating layer 14. When the through-holes 24 are formed by DRIE, they have a straight shape such that a cross section in the depth direction is substantially constant. However, the through-holes 24 are not limited to having such a straight shape, and they may have a tapered shape such that the cross sectional area decreases toward the deep end, or may have an inverse tapered shape such that the cross sectional area increases toward the deep end. Nor are there any particular restrictions on the method by which the through-holes 24 are formed, and if the working conditions are suitably adjusted, the through-holes 24 with a tapered or inverse tapered shape can be formed by DRIE.

Also, when the through-holes 24 are formed by DRIB, texturing on the order of from a few dozen to a few hundred nanometers is formed in the depth direction on the side faces of the through-holes 24. This texturing is called scalloping. If scalloping is formed on the side faces of the through-holes 24, the base portions 18 of the protrusions 19 formed in a subsequent process will be more securely fixed in the through-holes 24.

Figure 9A:
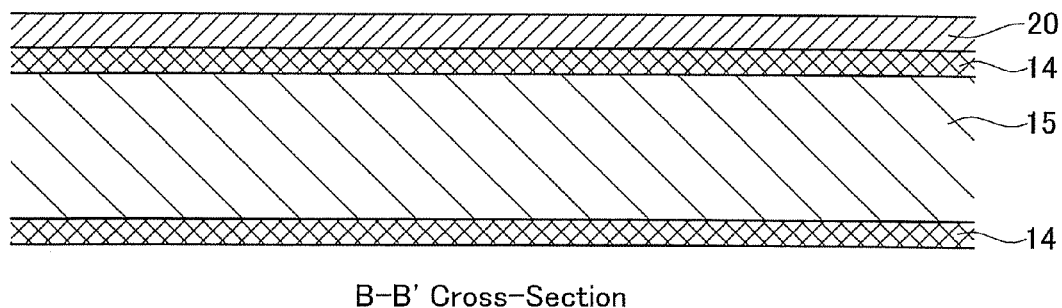
FIGS. 9a and 9b show process 3 of the process of manufacturing the biaxial acceleration sensor, and in particular.
Figure 9B:
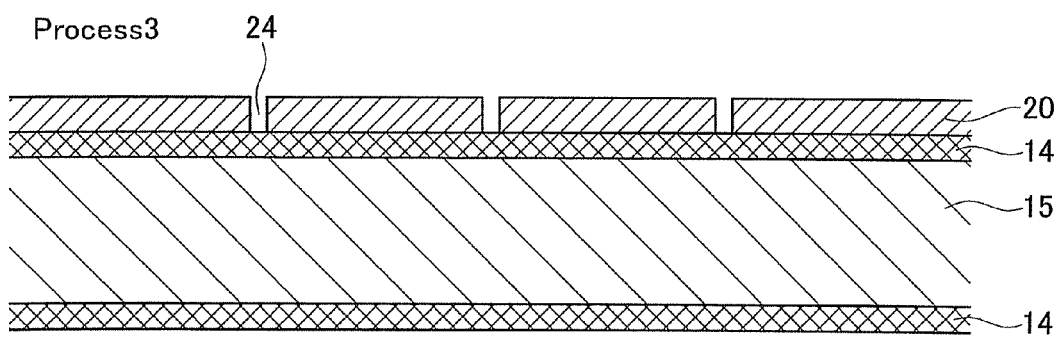

As shown in FIGS. 9a and 9b, in process 3, the first resist 21 is removed and the substrate is cleaned. An oxygen plasma or a stripper may be used to remove the first resist 21.

Figure 10A:
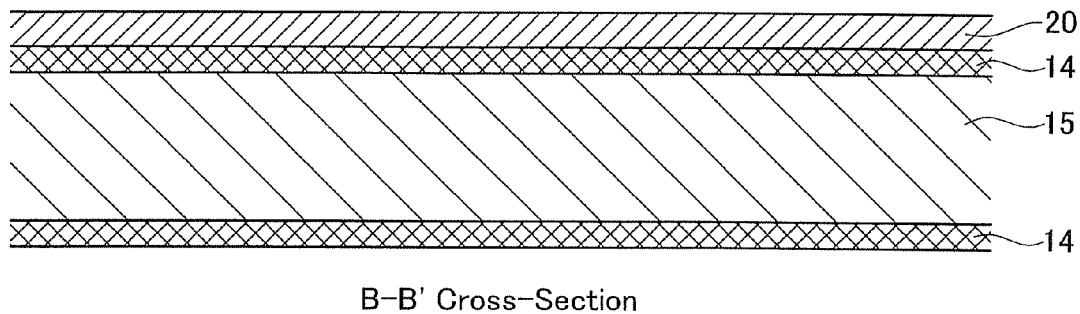
FIGS. 10a and 10b show process 4 of the process of manufacturing the biaxial acceleration sensor, and in particular.
Figure 10B:
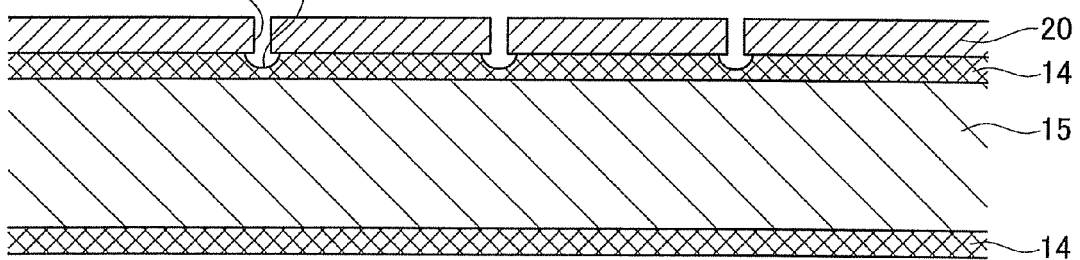

As shown in FIGS. 10a and 10b, in process 4, the insulating layer 14 is isotropically etched through the through-holes 24 to faun cavities 25 in the insulating layer 14. More specifically, a solution of BHF (buffered hydrofluoric acid) is sent through the through-holes 24 to the insulating layer 14, and the insulating layer 14 is isotropically etched. As a result, hemispherical cavities 25 are formed in the insulating layer 14. An alternative method is to perform vapor phase etching by vapor HF using hydrofluoric acid gas. Here again, the insulating layer 14 is isotropically etched to form hemispherical cavities 25.

The cavities 25 may also be formed by anisotropic etching in process 4. In this case, RIE (reactive ion etching) is performed through the through-holes 24, for example, to anisotropically etch the insulating layer 14. When the cavities 25 are formed by anisotropic etching, the shape of the cavities 25 is different from that when the cavities 25 are formed by isotropic etching. The shape of the cavities 25 produced by anisotropic etching will be discussed in detail in Embodiment 2 below.

Figure 11A:
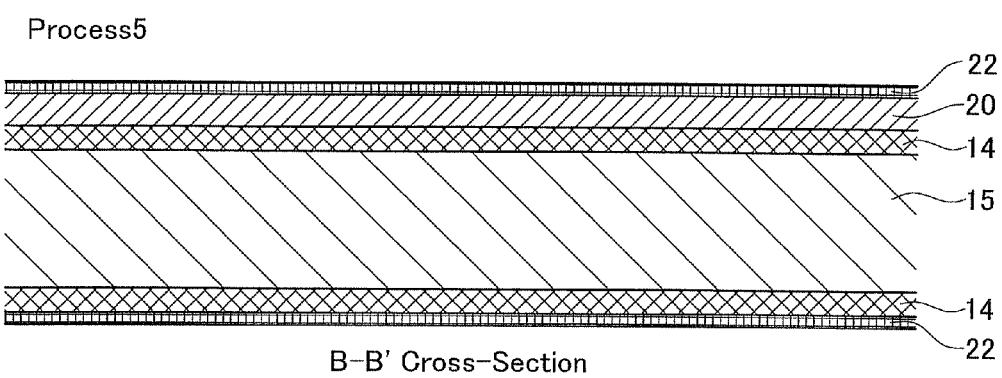
FIGS. 11a and 11b show process 5 of the process of manufacturing the biaxial acceleration sensor, and in particular.
Figure 11B:
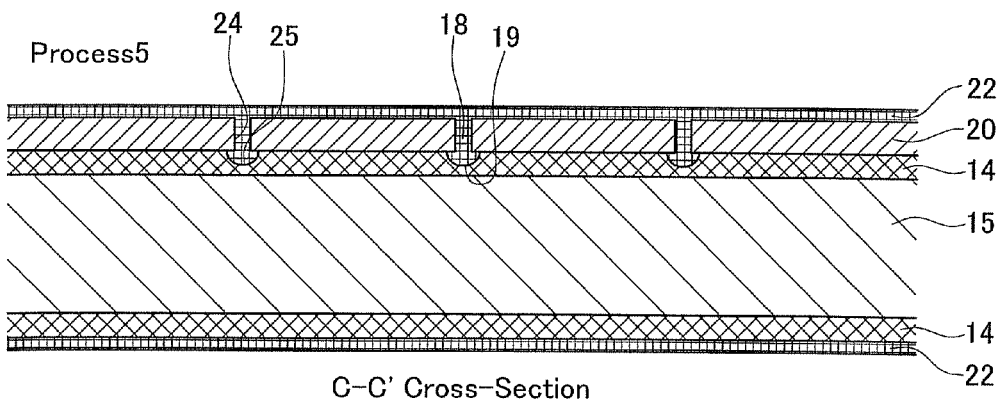

As shown in FIGS. 11a and 11b, in process 5, polysilicon is deposited on the substrate by low pressure CVD. Process 5 forms polysilicon films 22 on both sides of the substrate, and also fills the interior of the through-holes 24 and the cavities 25 with polysilicon. The polysilicon films 22 formed on both sides of the substrate here are removed in a subsequent process, so there is no particular need to manage their thickness. In process 5, the processing conditions and duration should be set so that the through-holes 24 and the cavities 25 are thoroughly filled with polysilicon. Process 5 forms the protrusions 19 and the base portions 18. Conductive impurities are preferably not added to the polysilicon here. This allows the electrical resistivity of the protrusions 19 and the base portions 18 to be improved.

Figure 12A:
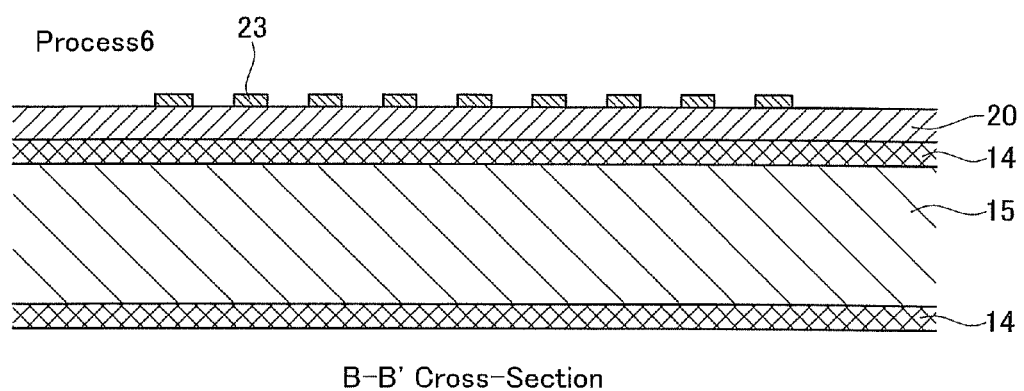
FIGS. 12a and 12b show process 6 of the process of manufacturing the biaxial acceleration sensor, and in particular.
Figure 12B:
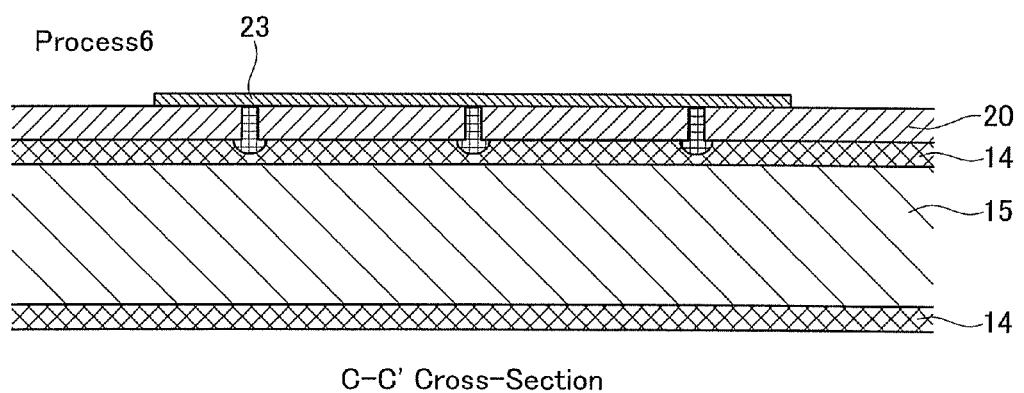

As shown in FIGS. 12a and 12b, in process 6, first the polysilicon film 22 on the support substrate 15 side is removed by CMP (chemical mechanical polishing). Next, the polysilicon film 22 on the bulk substrate 20 side is removed by the same method to expose the bulk substrate 20. Then, the surface on the bulk substrate 20 side is coated with a second resist 23, and a mask pattern for forming the movable mass 2 (including the first movable comb electrodes 4 and the second movable comb electrodes 7), the support arms 3, the anchors 9, the first fixed electrode 12a, and the second fixed electrode 12b is transferred to the second resist 23 by photolithography.

Figure 13A:
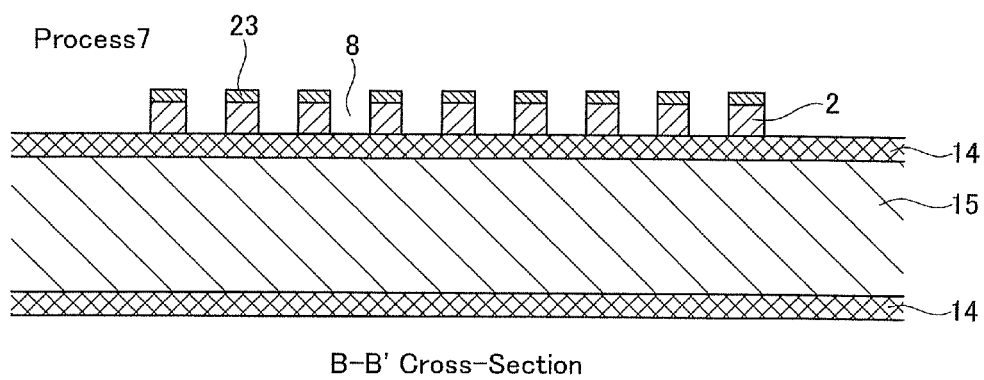
FIGS. 13a and 13b show process 7 of the process of manufacturing the biaxial acceleration sensor, and in particular.
Figure 13B:
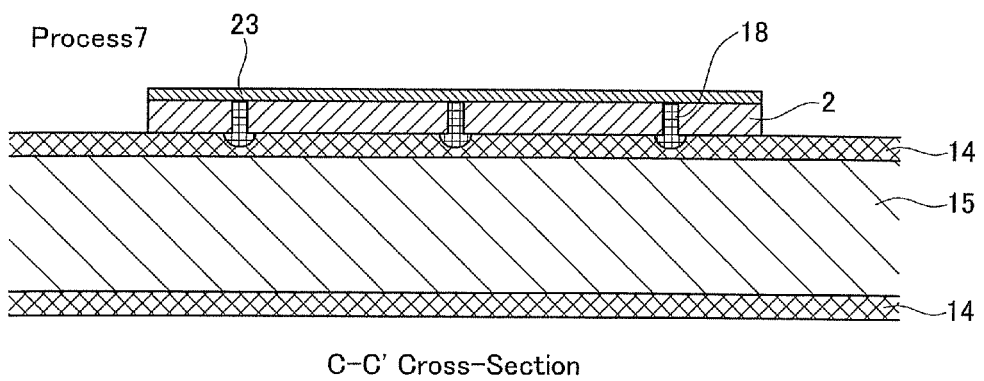

As shown in FIGS. 13a and 13b, in process 7, the bulk substrate 20 is subjected to DRIE using the second resist 23 as a mask. This fowls the movable mass 2 (including the first movable comb electrodes 4 and the second movable comb electrodes 7), the support arms 3, the anchors 9, the first fixed electrode 12a, and the second fixed electrode 12b from the bulk substrate 20. Rectangular holes 8 are also formed in the movable mass 2. Since the base portions 18 formed from polysilicon is covered by the second resist 23, they are not etched by the DRIE.

Figure 14A:
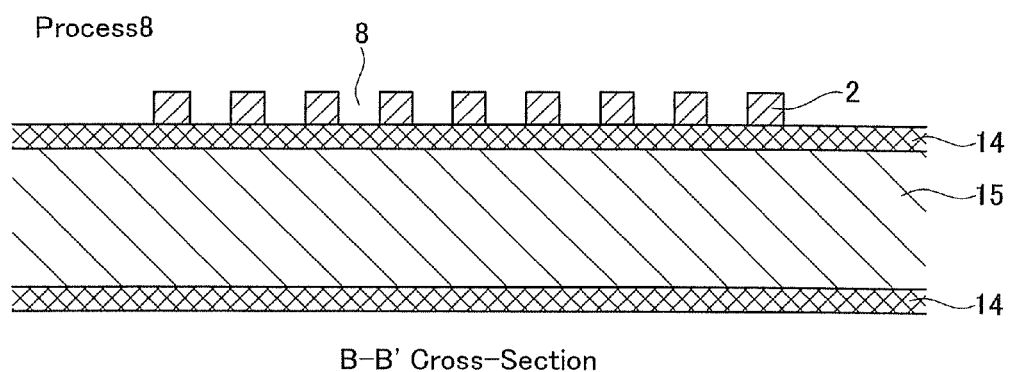
FIGS. 14a and 14b show process 8 of the process of manufacturing the biaxial acceleration sensor, and in particular.
Figure 14B:
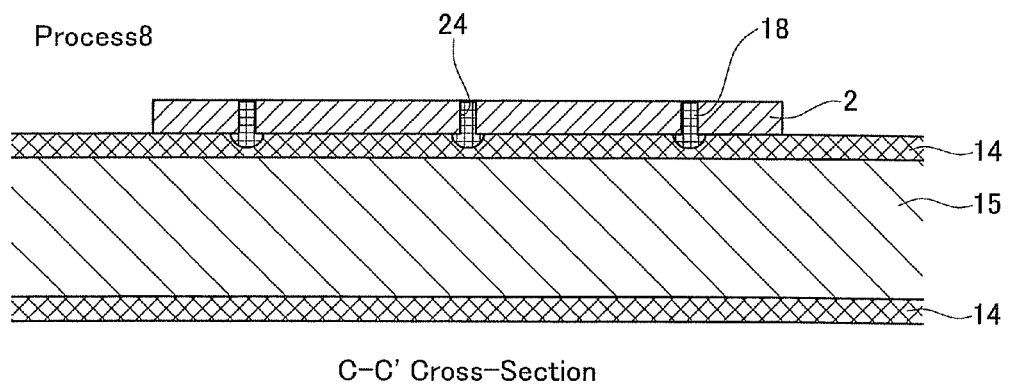

As shown in FIGS. 14a and 14b, in process 8, the second resist 23 is removed with an oxygen plasma or a stripper, and the substrate is cleaned.

Figure 15A:
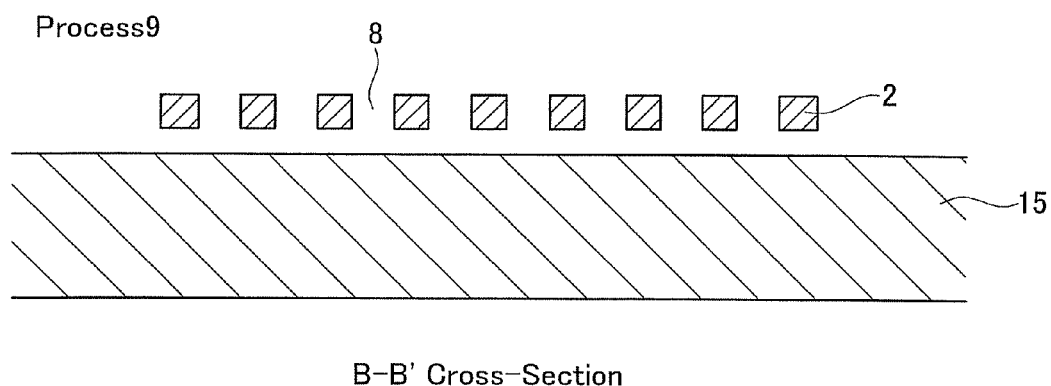
FIGS. 15a and 15b show process 9 of the process of manufacturing the biaxial acceleration sensor, and in particular.
Figure 15B:
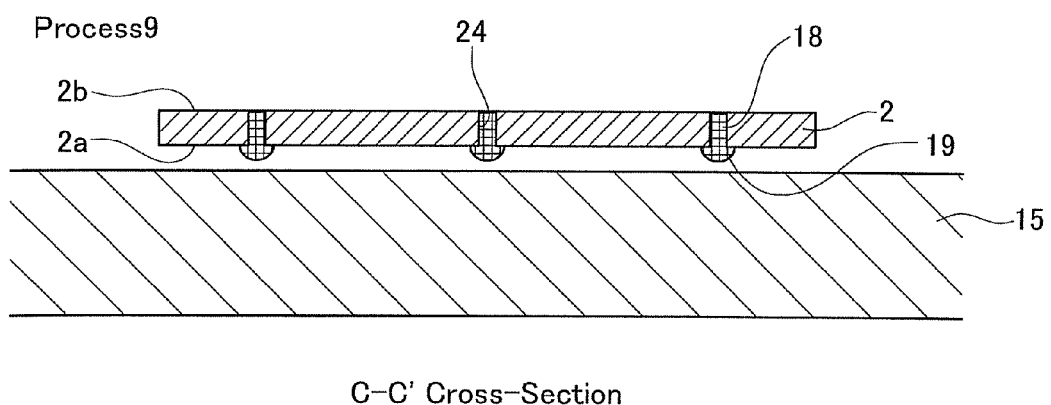

As shown in FIGS. 15a and 15b, in process 9, sacrificial layer etching is performed to remove the insulating layer 14 by vapor phase etching using vapor HF. This sacrificial layer etching removes the insulating layer 14 from between the movable mass 2 and the support substrate 15, and between the support arms 3 and the support substrate 15. Meanwhile, the insulating layer 14 is not completely removed from between the support substrate 15 and the anchors 9, or between the support substrate 15 and the first and second fixed electrodes 12a and 12b, and a part of the insulating layer 14 remains interposed. The sacrificial layer etching in process 9 can also be performed by wet etching using BHF, instead of vapor HF. The sacrificial layer etching in process 9 produces a state in which the movable mass 2 is opposing the support substrate 15 across a space, and is supported so as to move with respect to the support substrate 15. At this point, the plurality of protrusions 19 has already been formed on the lower face 2a of the movable mass 2 opposite the support substrate 15. Therefore, even if the insulating layer 14 is removed from between the movable mass 2 and the support substrate 15, the movable mass 2 and the support substrate 15 will still be prohibited from coming into direct contact.

The processes of manufacturing the biaxial acceleration sensor 1 from an SOI substrate have been described above, but another manufacturing processing involving joining of the substrate, rather than using an SOI substrate, is also possible. For example, the bulk substrate 20 on whose surface the insulating layer 14 has been formed is provided, and the protrusions 19 and the base portions 18 are formed on this bulk substrate 20. This formation of the protrusions 19 and the base portions 18 can be accomplished by the same method as in the manufacturing process described above. Specifically, the through-holes 24 are formed in the bulk substrate 20, the cavities 25 are formed in the insulating layer 14, and the through-holes 24 and the cavities 25 are filled with polysilicon. The bulk substrate 20 on which the protrusions 19 and the base portions 18 have been formed is then joined to a separately prepared support substrate 15, which gives a work-in-progress in process 6 of the above manufacturing process.

Also, the biaxial acceleration sensor 1 can be formed not only from silicon, but also from a laminate material obtained by laminating another semiconductor material with an insulating layer in between. Furthermore, the biaxial acceleration sensor 1 does not necessarily have to be formed from a semiconductor material, and can be formed from a laminate material in which some other conductive material is laminated with an insulating layer in between.

Figure 16:
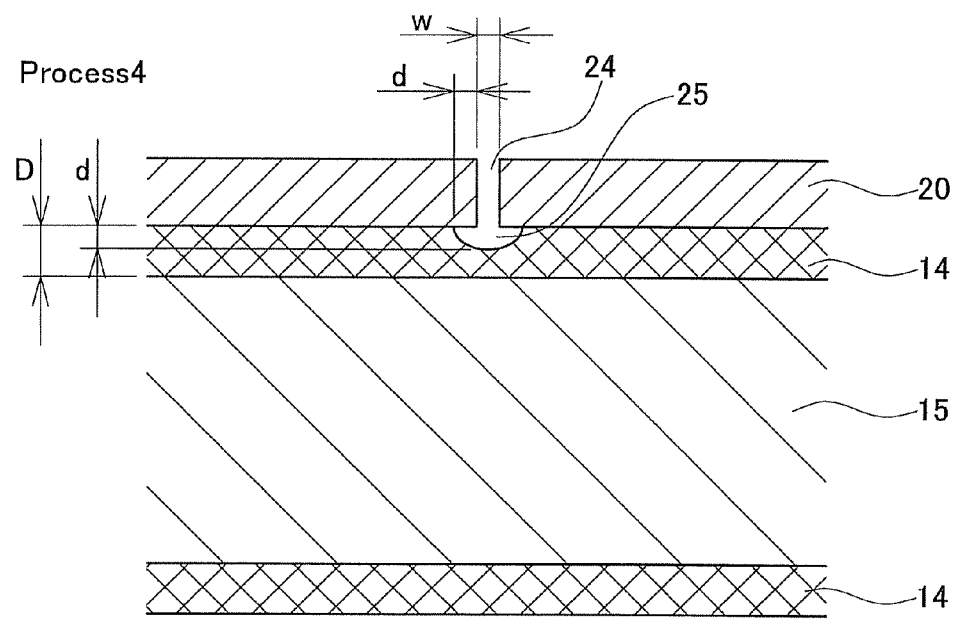
FIG. 16 shows a cavity formed in an insulating layer and a hole formed in a bulk substrate in process 4.

FIG. 16 is a detail view of one of the through-holes 24 formed in the bulk substrate 20 and one of the cavities 25 formed in the insulating layer 14 in process 4 of the above-mentioned manufacturing process. Note that the description hereinbelow applies to each of the through-holes 24 and cavities 25. The shapes of the through-holes 24 and the cavities 25 will be described through reference to FIG. 16. It is assumed that the cross sectional shape of the through-holes 24 is circular, and will let the diameter thereof be W. Further, the thickness of the insulating layer 14 is assumed to be D. In the isotropic etching of process 4, the etchant (BHF) goes through the through-holes 24 and reaches the insulating layer 14, and etching of the insulating layer 14 proceeds isotropically. Since the etching of the insulating layer 14 proceeds radially, if d is the height of the cavities 25, then etching proceeds by a distance d in the in-plane direction. Specifically, the cross sectional shape of the cavities 25 at the interface between the bulk substrate 20 and the insulating layer 14 is that of a circle having a diameter of W+2 d, and is larger than the diameter W of the through-holes 24 by 2 d. That is, the cavities 25 are formed in a flattened hemispherical shape, and the bottom faces of the cavities 25 are curved surfaces that have a radius of curvature R.

Figure 17:
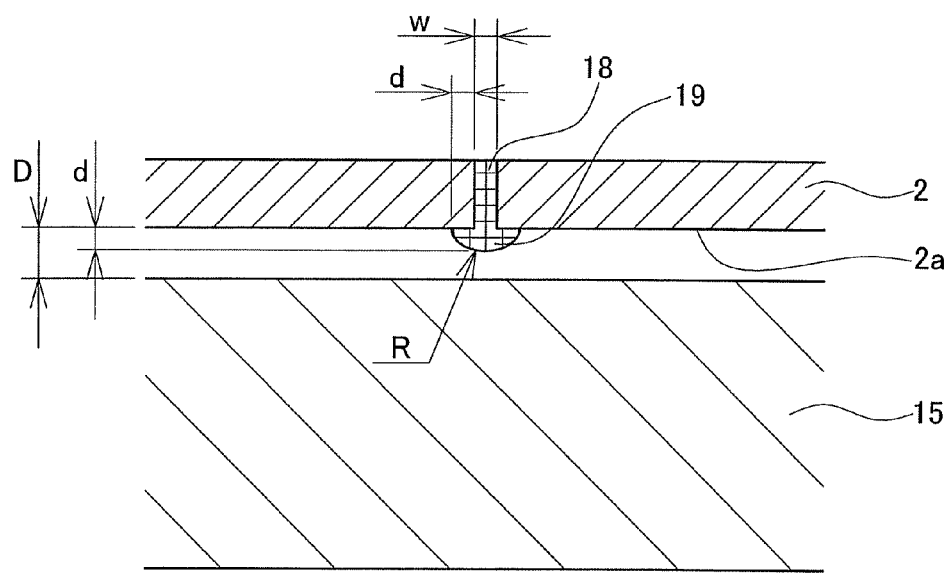
FIG. 17 shows a protrusion and a base portion formed on the bulk substrate.

FIG. 17 shows a state in which the insulating layer 14 has been removed by sacrificial layer etching after the through-hole 24 and cavity 25 were filled with polysilicon. Specifically, it shows the cross sectional structure of the protrusion 19 and the base portion 18 formed on the movable mass 2. Note that the description hereinbelow applies to each of the protrusions 19 and base portions 18. As shown in FIG. 17, positions and shapes of the protrusion 19 and the base portion 18 coincide with those of the cavity 25 and the through-hole 24. Specifically, the protrusion 19 is formed on the lower face 2a opposite the support substrate 15 of the movable mass 2. The base portion 18 is formed integrally with the protrusion 19, and the base portion 18 extends into the movable mass 2. The height of the protrusion 19 is d, and the cross sectional shape of the protrusion 19 where it connects to the base portion 18 is that of a circle having a diameter of W+2 d. At the connection between the protrusion 19 and the base portion 18, the diameter of W+2 d of the protrusion 19 is 2 d greater than the diameter W of the base portion 18. Because of this, the protrusion 19 is also joined to the lower face 2a of the movable mass 2. The height d of the protrusion 19 is less than the thickness D of the insulating layer 14, and the distal end of the protrusion 19 is separated away from the surface of the support substrate 15. The protrusion 19 has a somewhat flattened hemispherical shape, and its distal end is a curved surface that has a radius of curvature R.

Figure 18:
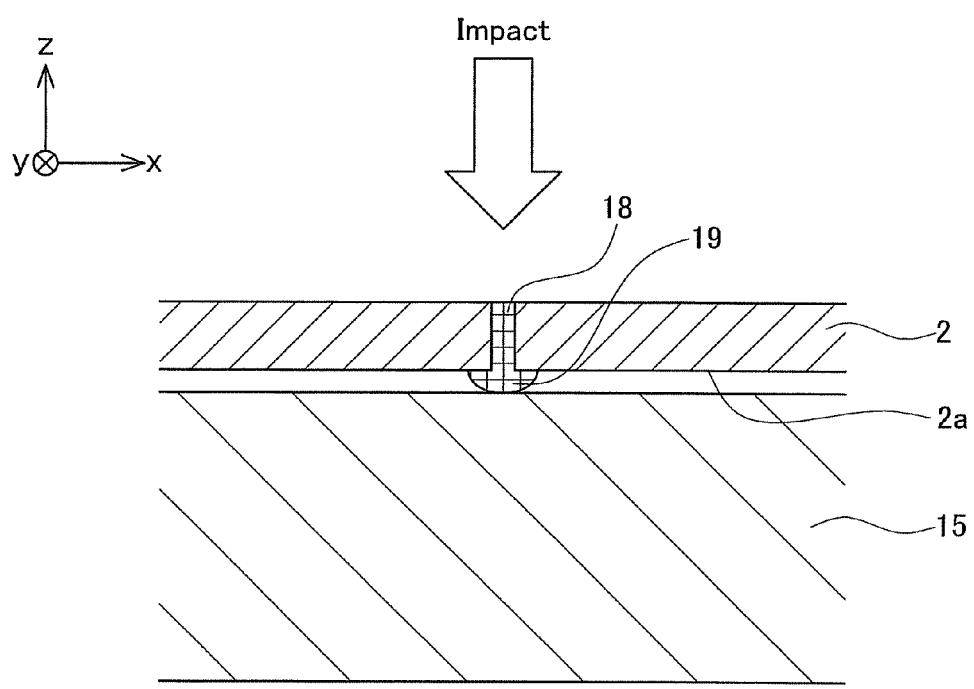
FIG. 18 shows a state in which an impact in the z axis direction has been applied to the biaxial acceleration sensor, and a movable mass and a support substrate have collided via the protrusion.

FIG. 18 shows a state in which the biaxial acceleration sensor 1 has been subjected to impact force in the z axis direction, and the movable mass 2 and the support substrate 15 have collided via the protrusion 19. As shown in FIG. 18, when the biaxial acceleration sensor 1 is subjected to impact force in the z axis direction, the movable mass 2 moves closer to the support substrate 15. At this point, the distal end of the protrusion 19 is touching the support substrate 15, but the lower face 2a of the movable mass 2 does not touch the support substrate 15. Since the movable mass 2 and the support substrate 15 are prohibited from coming into direct contact, the movable mass 2 and the support substrate 15 do not stick together. Even if the biaxial acceleration sensor 1 should be subjected to repeated impact force so that the protrusions 19 repeatedly hit the support substrate 15, since the protrusions 19 are securely held by the base portions 18, the protrusions 19 are prevented from coming loose from the movable mass 2. This prevents the movable mass 2 and the support substrate 15 from sticking together over an extended period of time.

The distal ends of the protrusions 19 are curved surfaces that curve in a spherical shape. Therefore, even though the protrusions 19 are in contact with the support substrate 15, the stress produced in the protrusions 19 or the support substrate 15 is kept low. This prevents damage to the protrusions 19 and the support substrate 15. Furthermore, because the protrusions 19 are formed from polysilicon, which has high electrical resistivity, even though the movable mass 2 and the support substrate 15 come into contact via the protrusions 19, there is no electrical short circuiting between the movable mass 2 and the support substrate 15.

Embodiment 2

Figure 19:
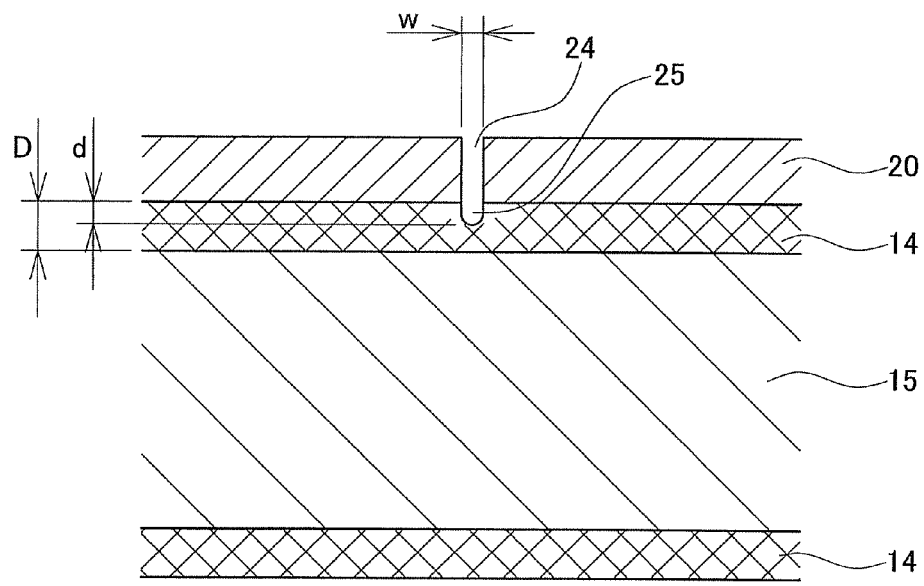
FIG. 19 shows the cavity formed in the insulating layer and the hole formed in the bulk substrate in order to form the protrusion in Embodiment 2.
Figure 20:
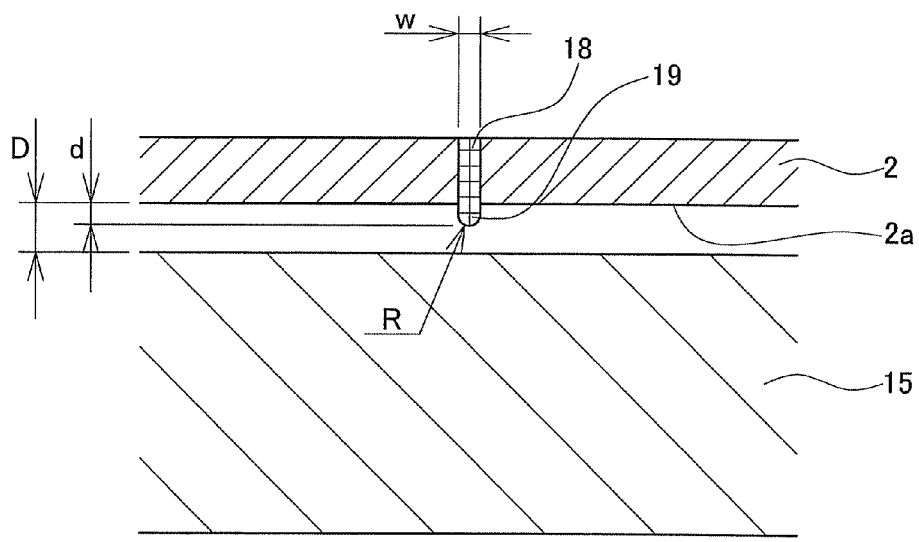
FIG. 20 shows the protrusion and base portion of Embodiment 2.

In Embodiment 2, a variant of the protrusions 19 will be described. FIG. 19 shows one of the through-holes 24 formed in the bulk substrate 20 and the corresponding cavity 25 formed in the insulating layer 14, in order to form the protrusion 19 of Embodiment 2. The state shown in FIG. 19 corresponds to the state of process 4 in the manufacturing process described in Embodiment 1. FIG. 20 shows the base portions 18 and protrusions 19 of Embodiment 2 formed by these through-holes 24 and cavities 25. When the protrusions 19 of Embodiment 2 are formed, the insulating layer 14 may be subjected to anisotropic etching in process 4 of the manufacturing process described in Embodiment 1. More specifically, the insulating layer 14 may be subjected to RIE through the through-holes 24. This forms the cavities 25 in the shape shown in FIG. 19. These cavities 25 have distal ends with a bullet-like shape. If W is the diameter of the through-holes 24, then the diameter of the cavities 25 where they connect to the corresponding through-holes 24 is also substantially the same diameter W.

The through-holes 24 and cavities 25 shown in FIG. 19 are filled with polysilicon, and the insulating layer 14 is removed by sacrificial layer etching, which gives the protrusions 19 and the base portions 18 shown in FIG. 20. Specifically, the distal ends of the protrusions 19 are curved surfaces that have a radius of curvature R, and the diameter of the protrusions 19 where they connect with the base portions 18 is W, which is equal to that of the base portions 18. Also, the height d of the protrusions 19 is less than the thickness D of the insulating layer 14.

With the structure of the protrusions 19 in Embodiment 2, once again direct contact is prohibited between the movable mass 2 and the support substrate 15, which prevents the movable mass 2 and the support substrate 15 from sticking together. The protrusions 19 are securely held by the integrally molded base portions 18, which prevent them from coming loose from the movable mass 2. This prevents the movable mass 2 and the support substrate 15 from sticking together over an extended period of time.

To increase the stiffness of the protrusions 19 and prevent the protrusions 19 from detaching, it is effective for the base portions 18 to have a tapered or inverse tapered shape. In this case, the through-holes 24 formed in the bulk substrate 20 may be given a tapered or inverse tapered shape. The through-holes 24 can be properly worked by DRIE into a tapered shape that has a slope of ±10°. The tapered base portions 18 are less likely to come out of the movable mass 2, so the detachment of the protrusions 19 can be prevented more effectively. Giving a tapered shape to the base portions 18 here is not limited to the protrusions 19 of Embodiment 2, and is also effective with the protrusions 19 of Embodiment 1 or other embodiments.

Embodiment 3

Figure 21A:
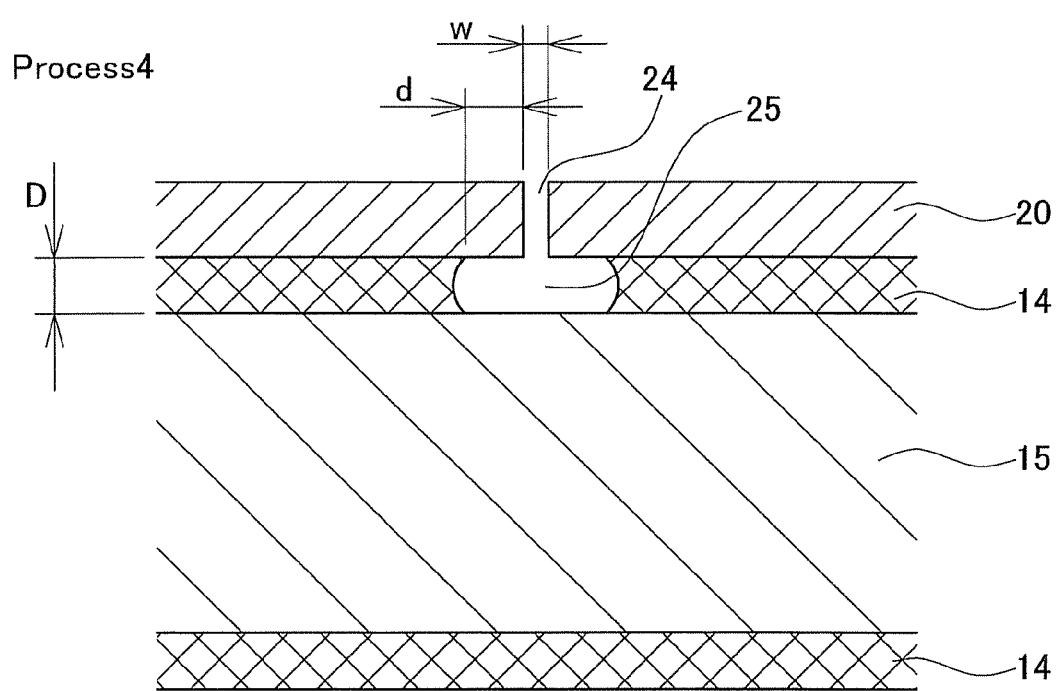
FIGS. 21a, 21b, and 21c show the process of forming the protrusion and the base portion in Embodiment 3, with FIG. 21a showing the state in process 4, FIG. 21b the state in process 5, and FIG. 21c the state in process 8.
Figure 21B:
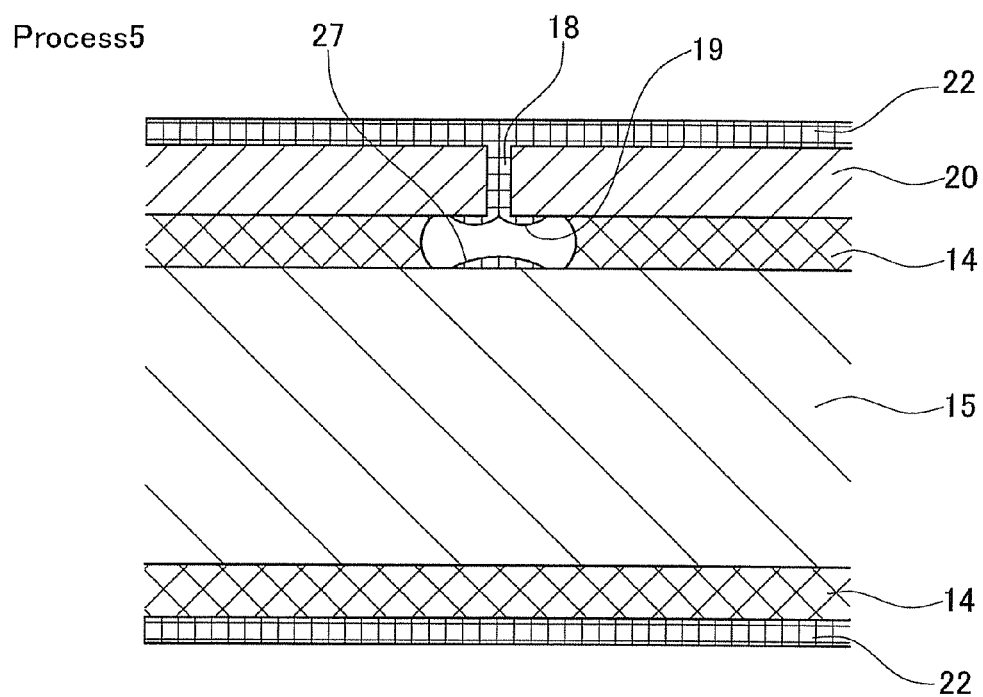
Figure 21C:
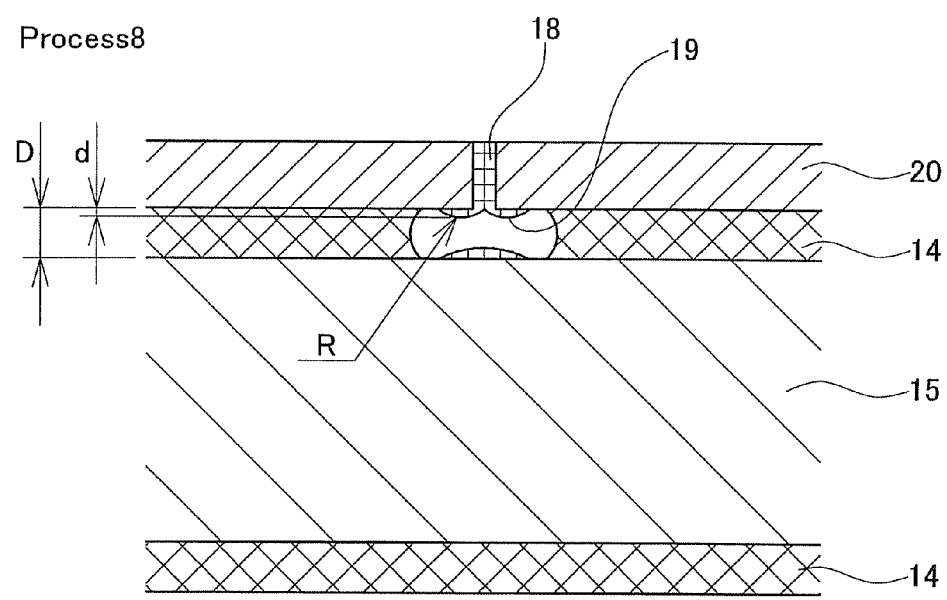

In Embodiment 3, another variant of the protrusions 19 will be described. FIGS. 21a, 21b, and 21c show the states in processes 4, 5, and 8 when forming the protrusions 19 in Embodiment 3. When the protrusions 19 of Embodiment 3 are formed, isotropic etching of the insulating layer 14 with a BHF solution can be performed in process 4 of the manufacturing process described in Embodiment 1. Here, if the treatment time is set relatively long; then as shown in FIG. 21a, the cavities 25 are expanded in the lateral direction, and the insulating layer 14 will be etched until the surface of the support substrate 15 is exposed.

Next, in process 5, as shown in FIG. 21b, the through-holes 24 and the cavities 25 are filled with polysilicon. Inside the cavities 25 here, second protrusions 27 are formed on the exposed face of the support substrate 15 simultaneously with the formation of the protrusions 19 on the exposed face of the bulk substrate 20. The distal ends of the protrusions 19 formed on the bulk substrate 20 are curved surfaces with a radius of curvature R. The distal ends of the second protrusions 27 formed on the support substrate 15 are also curved surfaces, but with a different radius of curvature. If the cavities 25 are formed larger as in this embodiment, the through-holes 24 will be blocked with polysilicon before the polysilicon fills the cavities 25 entirely.

As shown in FIG. 21c, the height d of the protrusions 19 formed on the movable mass 2 is far less than the thickness D of the insulating layer 14. However, the second protrusions 27 formed on the support substrate 15 are opposing the protrusions 19 formed on the movable mass 2. Therefore, an adequate space is always ensured between the movable mass 2 and the support substrate 15 by the two opposing protrusions 19 and 27. This prevents the movable mass 2 and the support substrate 15 from coming into direct contact. Also, since the protrusions 19 are securely held by the integrally molded base portions 18, they are prevented from detaching from the movable mass 2. This prevents the movable mass 2 and the support substrate 15 from sticking together over an extended period of time.

Embodiment 4

Figure 22:
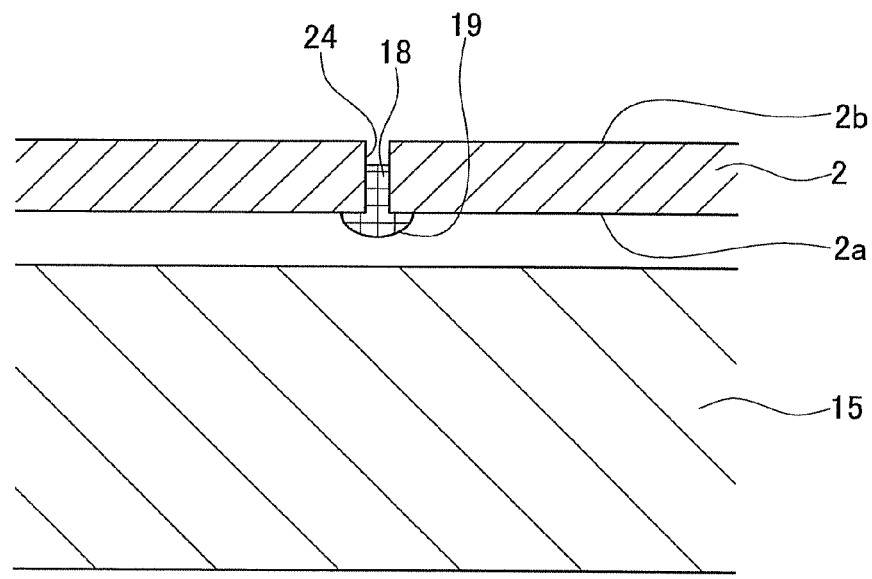
FIG. 22 shows the protrusion and base portion of Embodiment 4.

In Embodiment 4, another variant of the protrusions 19 will be described. FIG. 22 is a cross section of one of the protrusions 19 and its corresponding base portion 18 in Embodiment 4. The protrusions 19 in Embodiment 4 have the same shape as in Embodiment 1, but the base portions 18 have a characteristic shape. Specifically, as shown in FIG. 22, the base portions 18 are shorter, and their upper ends are recessed inward with respect to the upper face 2b of the movable mass 2. This recessing of the base portions 18 is sometimes formed in process 6 of the manufacturing process described in Embodiment 1. More specifically, when the polysilicon film 22 is polished by CMP, the polysilicon in the through-holes 24 is also sometimes removed at the same time, and as a result the base portions 18 are recessed with respect to the upper face 2b of the movable mass 2. Nevertheless, even when the base portions 18 have a shape such as this, detachment of the protrusions 19 is still adequately prevented. Specifically, detachment of the protrusions 19 is adequately prevented as long as the base portions 18 that are molded integrally with the protrusions 19 are embedded inside the movable mass 2.

Embodiment 5

Figure 23:
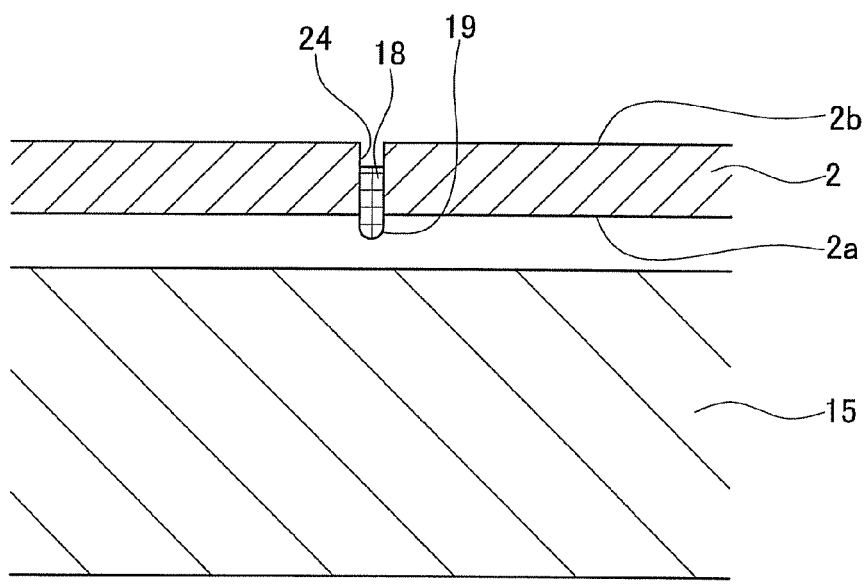
FIG. 23 shows the protrusion and base portion of Embodiment 5.

In Embodiment 5, another variant of the protrusions 19 will be described. FIG. 23 is a cross section of one of the protrusions 19 and its corresponding base portion 18 in Embodiment 5. The protrusions 19 in Embodiment 5 have a shape that combines the shapes of the protrusions 19 of Embodiment 2 and the base portions 18 of Embodiment 4. As is clear from the description of Embodiments 2 and 4, the protrusions 19 and base portions 18 of Embodiment 5 also prevent the movable mass 2 and the support substrate 15 from sticking together over an extended period of time.

Embodiment 6

Figure 24:
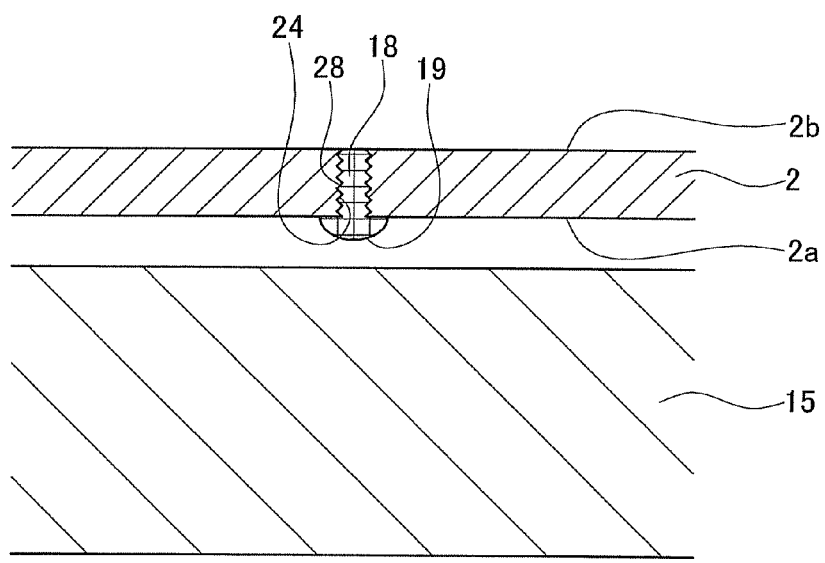
FIG. 24 shows the protrusion and base portion of Embodiment 6.

In Embodiment 6, another variant of the protrusions 19 will be described. FIG. 24 is a cross section of one of the protrusions 19 and its corresponding base portion 18 in Embodiment 6. The protrusions 19 in Embodiment 6 have the same shape as those in Embodiment 1, but the base portions 18 have a characteristic shape. Specifically, as shown in FIG. 24, bumps 28 are formed in the axial direction on the side faces of the base portions 18 (the interface with the movable mass 2). These bumps on the base portions 18 are produced by bumps formed on the side faces of the through-holes 24. In the formation of the through-holes 24 by DRIE, protection with a polymer cover film and remove by etching are alternately repeated, which forms bumps on the side faces of the through-holes 24 in the axial direction. These bumps are called scalloping. The bumps produced by scalloping are usually from a few dozen to a few hundred nanometers in size. Forming this scalloping on the side faces of the through-holes 24 also forms corresponding bumps 28 in the axial direction on the side faces of the base portions 18. When the bumps 28 are formed on the side faces of the base portions 18, the base portions 18 are less likely to come out of the through-holes 24. This configuration more effectively prevents the detachment of the protrusions 19, and prevents the movable mass 2 and the support substrate 15 from sticking together over a longer period of time.

Embodiment 7

Figure 25:
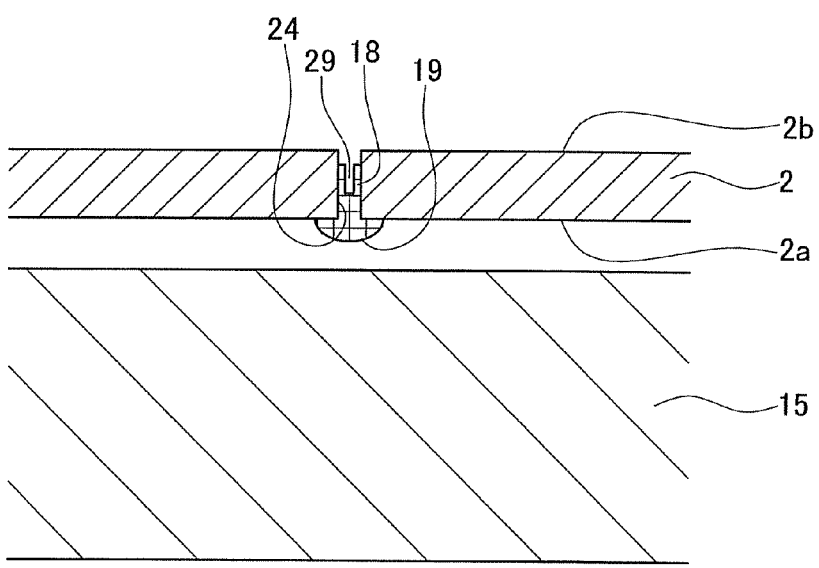
FIG. 25 shows the protrusion and base portion of Embodiment 7.

In Embodiment 7, another variant of the protrusions 19 will be described. FIG. 25 is a cross section of one of the protrusions 19 and its corresponding base portion 18 in Embodiment 7. The protrusions 19 in Embodiment 7 have the same shape as in Embodiment 1, but the base portions 18 have a characteristic shape. Specifically, as shown in FIG. 25, the base portions 18 are shorter, and their upper ends are recessed inward with respect to the upper face 2b of the movable mass 2. The reason for recessing the base portions 18 is as described in Embodiment 4. Furthermore, cavities 29 are formed in the base portions 18. These cavities 29 may be produced by incomplete filling with polysilicon by CVD. Nevertheless, even when the cavities 29 are present in the base portions 18, the base portions 18 will not readily come out as long as they are snugly fitted against the side faces of the through-holes 24. Specifically, detachment of the protrusions 19 is significantly prevented, and the movable mass 2 and the support substrate 15 are prevented from sticking together over an extended period of time.

The above-mentioned cavities 29 are not to being formed in polysilicon, and can also be produced when the protrusions 19 and the base portions 18 are formed from a metal. Specifically, even when the through-holes 24 and the cavities 25 are filled with metal, the cavities 29 may still occur in this filling metal. Here again, however, the base portions 18 will not readily come out as long as they are snugly fitted against the side faces of the through-holes 24. Specifically, detachment of the protrusions 19 is effectively prevented, and the movable mass 2 and the support substrate 15 are prevented from sticking together over an extended period of time.

Embodiment 8

Figure 26:
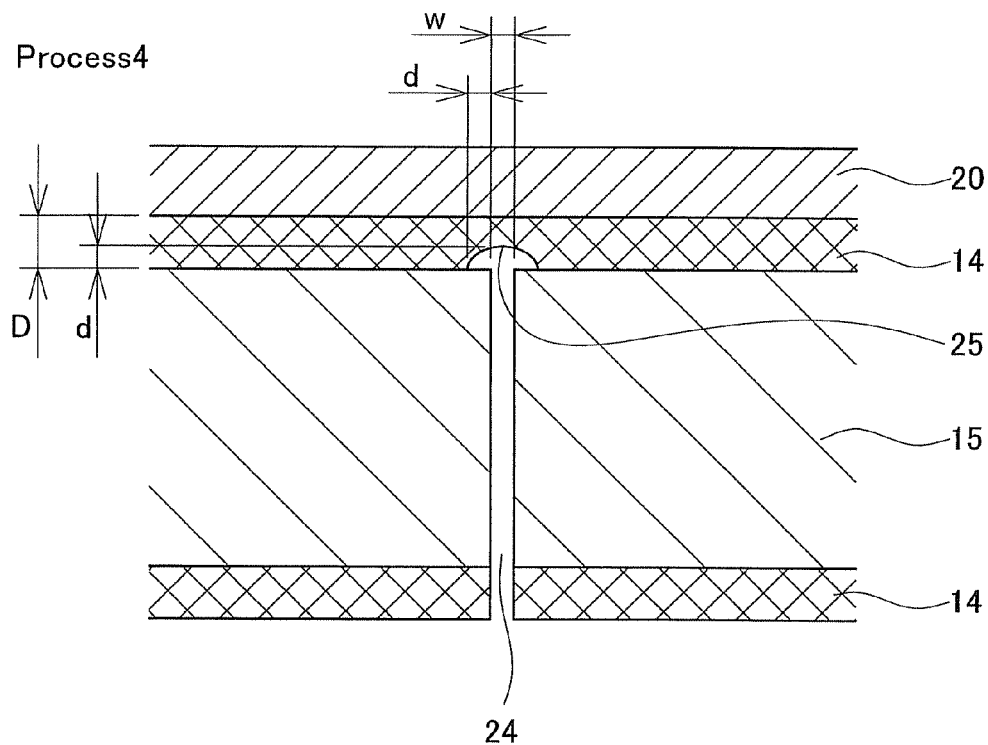
FIG. 26 shows the cavity formed in the insulating layer and the hole formed in the bulk substrate in order to form the protrusion and base portion of Embodiment 8.
Figure 27:
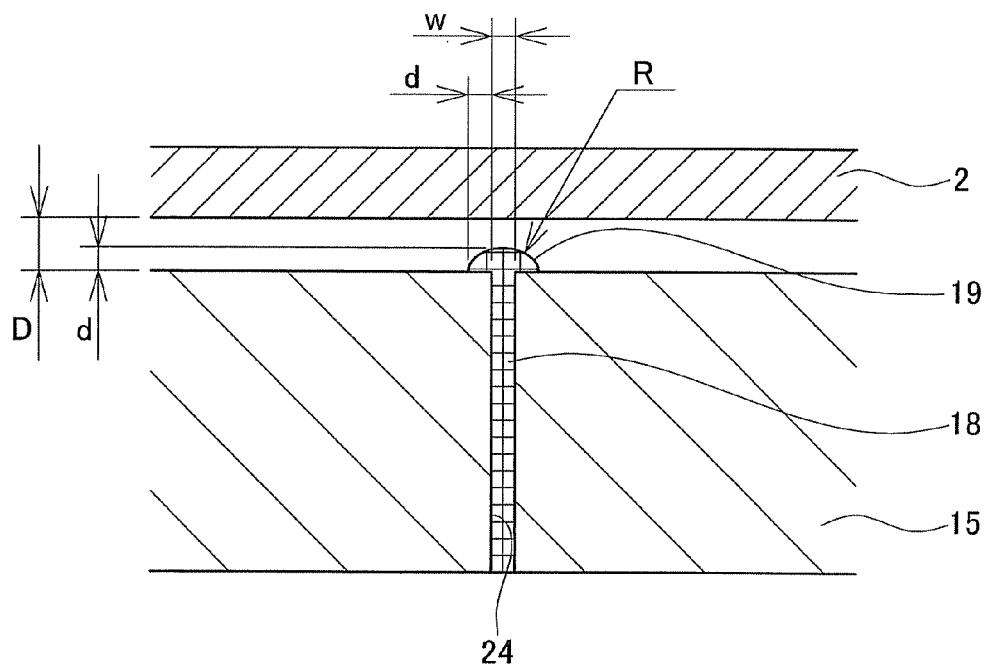
FIG. 27 shows the protrusion and base portion of Embodiment 8.

In Embodiment 8, a situation in which the protrusions 19 are formed on the support substrate 15 is described. FIG. 26 shows the state in process 4 when the protrusions 19 are formed on the support substrate 15, and shows the through-holes 24 formed in the support substrate 15 and the cavities 25 formed in the insulating layer 14. FIG. 27 shows one of the protrusions 19 and its corresponding base portion 18 fanned by the aforesaid through-holes 24 and cavities 25.

As shown in FIG. 26, when the protrusions 19 are formed on the support substrate 15, the through-holes 24 are formed in the support substrate 15. The through-holes 24 are formed deep enough to reach the insulating layer 14, just as when formed in the bulk substrate 20. When the insulating layer 14 is then etched through the through-holes 24, cavities 25 that are contiguous with the through-holes 24 are formed in the insulating layer 14. The dimensions W, d, and D of the various components can be the same as e.g., in Embodiment 1. After this, the through-holes 24 and the insulating layer 14 are filled with polysilicon to integrally form the protrusions 19 and the base portions 18 as shown in FIG. 27.

Again when the protrusions 19 and base portions 18 are formed on the support substrate 15, the movable mass 2 and the support substrate 15 are prevented from coming into direct contact, and the movable mass 2 and the support substrate 15 are prevented from sticking together. The protrusions 19 formed on the support substrate 15 are securely held by the base portions 18 embedded in the support substrate 15, so they are prevented from detaching from the support substrate 15 even after repeated collisions with the movable mass 2. Even when the protrusions 19 are formed on the support substrate 15, the movable mass 2 and the support substrate 15 are prevented from sticking together over an extended period of time. Furthermore, it is also effective for the protrusions 19 and the base portions 18 to be formed not on just the movable mass 2 or the support substrate 15, but on both.

Embodiment 9

Figure 28:
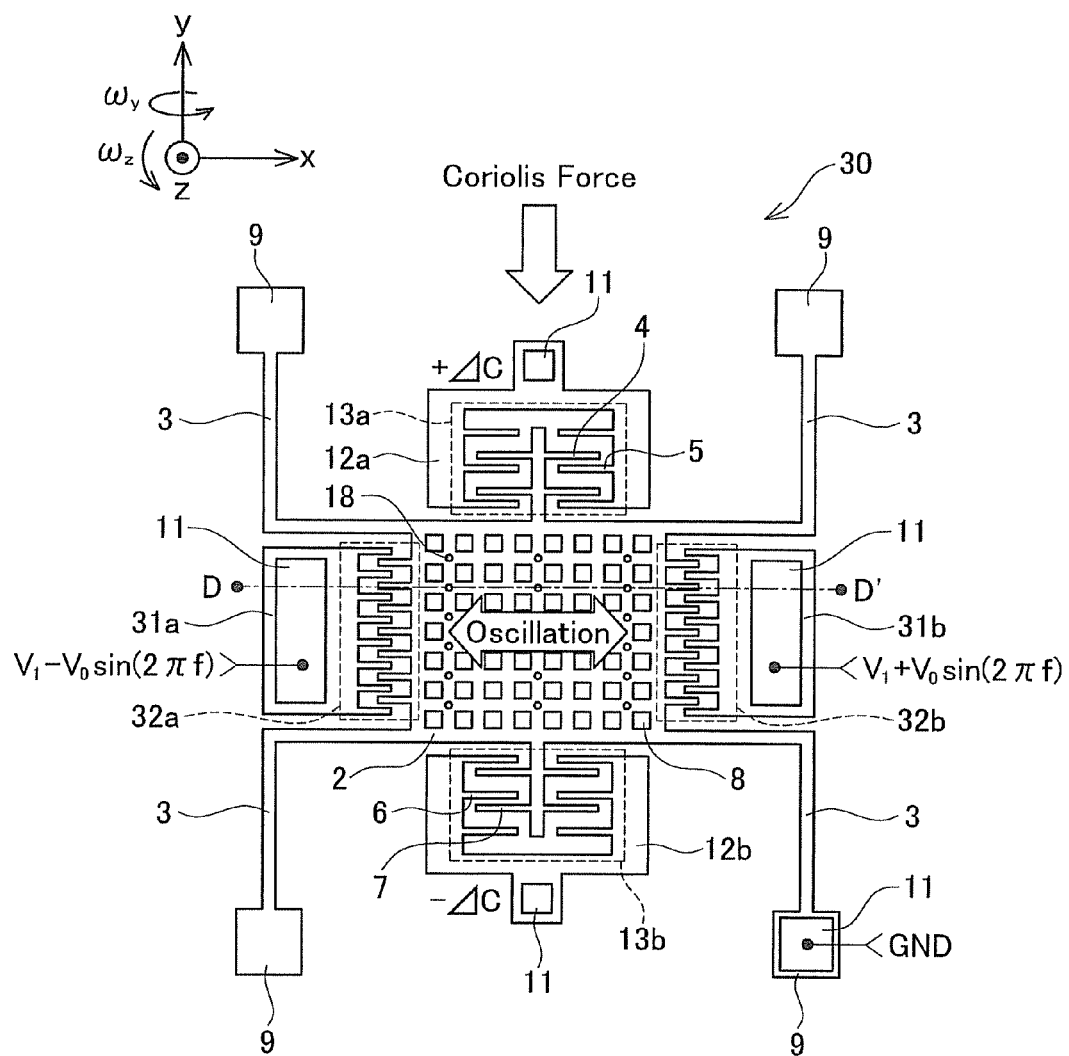
FIG. 28 is a plan view of a biaxial angular rate sensor in Embodiment 9.
Figure 29:
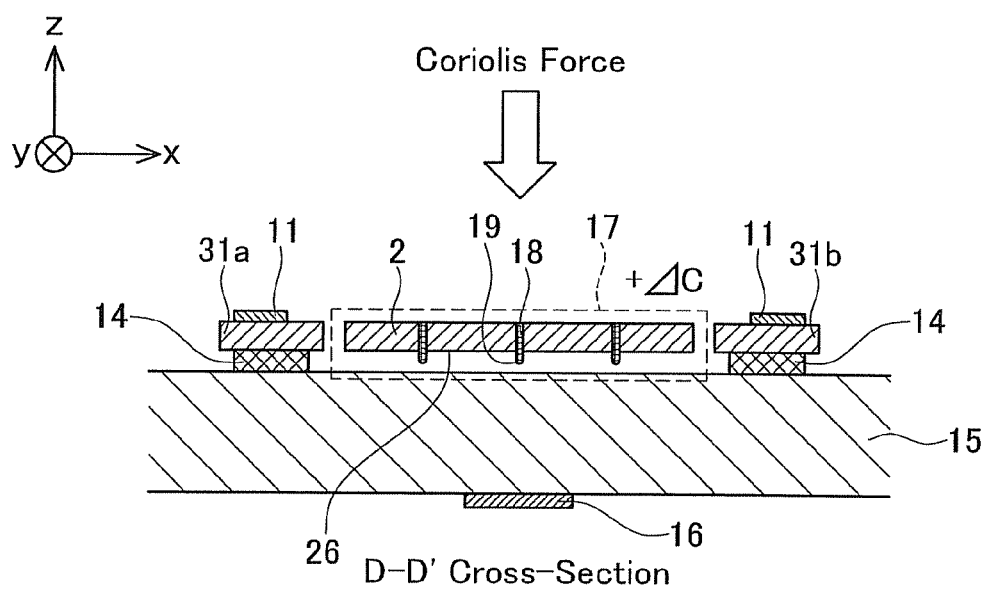
FIG. 29 is a D-D' cross section of the biaxial angular rate sensor shown in FIG. 28.

An oscillating type of biaxial angular rate sensor 30 to which the present teachings are applied will be described in Embodiment 9. FIG. 28 shows the structure of the biaxial angular rate sensor 30 in this embodiment in plan view. FIG. 29 is a cross section of the biaxial angular rate sensor 30 shown in FIG. 28, at the D-D' location. The biaxial angular rate sensor 30 is a micro device capable of detecting the angular rate around the z axis and the angular rate around the y axis.

The biaxial angular rate sensor 30 in this embodiment is the same as the biaxial acceleration sensor 1 in Embodiment 1 in terms of most of its components. The components that are shared with the biaxial acceleration sensor 1 in Embodiment 1 will be numbered the same, and redundant description will be avoided herein.

As shown in FIGS. 28 and 29, the biaxial angular rate sensor 30 comprises a support substrate 15, four anchors 9 that are fixed to the top face of the support substrate 15 with an insulating layer 14 in between, a movable mass 2 that is opposite the support substrate 15 across a space and that is positioned in the approximate center with respect to the four anchors 9, and four support arms 3 extending from the movable mass 2 to the respective anchors 9.

With the biaxial angular rate sensor 30 of this embodiment, the support aims 3 each comprises a portion that extends in the x axis direction and a portion that extends in the y axis direction. Consequently, the movable mass 2 is able to move in the x, y, and z axis directions with respect to the 15, and is supported rotatably around the x, y, and z axes.

The biaxial angular rate sensor 30 further comprises a first drive capacitor 32a and a second drive capacitor 32b for oscillating the movable mass 2 in the x axis direction, a first detecting capacitor 13a and a second detecting capacitor 13b for detecting Coriolis force generated in the y axis direction, and a third detecting capacitor 17 for detecting Coriolis force generated in the z axis direction. The first drive capacitor 32a is constituted by a comb teeth portion formed in a first drive fixed electrode 31a, and a comb teeth portion formed in the movable mass 2 opposite the other comb teeth portion. Here, the first drive fixed electrode 31a is fixed to the support substrate 15 via the insulating layer 14. A second drive capacitor 32b is constituted by a comb teeth portion formed in a second drive capacitor 31b, and a comb teeth portion formed in the movable mass 2 opposite the other comb teeth portion. Here, the second drive capacitor 31b is fixed to the support substrate 15 via the insulating layer 14. The configuration of the first detection capacitor 13a, the second detecting capacitor 13b, and the third detecting capacitor 17 is the same as described in Embodiment 1, and will therefore not be described again here.

As shown in FIG. 29, with the biaxial angular rate sensor 30 of this embodiment, a plurality of protrusions 19 are provided to the surface of the movable mass 2 that is opposite the support substrate 15. A base portion 18 extending into the movable mass 2 is molded integrally with each of the protrusions 19. These protrusions 19 and base portions 18 are configured as described in Embodiment 2.

Also with the biaxial angular rate sensor 30 of this embodiment, direct contact is prohibited between the movable mass 2 and the support substrate 15 by the protrusions 19 provided in the movable mass 2, which prevents the movable mass 2 and the support substrate 15 from sticking together. Furthermore, since the protrusions 19 are each securely held by the integrally molded base portions 18, even after repeated collisions with the support substrate 15, the protrusions 19 are prevented from coming loose or detaching from the movable mass 2. This prevents the movable mass 2 and the support substrate 15 from sticking together over an extended period of time.

The operation of the biaxial angular rate sensor 30 will now be described. With the biaxial angular rate sensor 30, the movable mass 2 is oscillated in the x axis direction in order to detect the angular rate $\omega_z$ around the z axis and the angular rate $\omega_y$ around the y axis. More specifically, as shown in FIG. 28, an AC voltage $V_1 - V_0 \sin(2\pi f)$ is applied to an electrode pad 11 provided to the first drive fixed electrode 31a, and an AC voltage $V_1 + V_0 \sin(2\pi f)$ is applied to an electrode pad 11 provided to the second drive fixed electrode 31b. Here, $V_1 > V_0$ is assumed. Consequently, an electrostatic force is generated in the first drive capacitor 32a and the second drive capacitor 32b, and the movable mass 2 oscillates at a frequency f in the x axis direction.

If the angular rate $\omega_z$ around the z axis is applied to the biaxial angular rate sensor 30 in a state in which the movable mass 2 is oscillating at a frequency f in the x axis direction, a Coriolis force in the y axis direction acts on the movable mass 2. The Coriolis force in the y axis direction acting on the movable mass 2 is detected by the first detection capacitor 13a and the second detecting capacitor 13b. For example, as shown in FIG. 28, when Coriolis force acts in the y axis negative direction, the movable mass 2 moves in the y axis negative direction. In this case, an increase in electrostatic capacity (+ΔC) is detected by the first detection capacitor 13a, and a decrease in electrostatic capacity (−ΔC) is detected by the second detecting capacitor 13b. If these changes in electrostatic capacitance are subjected to differential amplification, a change in electrostatic capacitance (+ΔC×2) can be obtained. The angular rate $\omega_z$ around the z axis applied to the biaxial angular rate sensor 30 can be measured on the basis of the resulting change in electrostatic capacitance (+ΔC×2).

Meanwhile, if the angular rate $\omega_y$ around the y axis is applied to the biaxial angular rate sensor 30 in a state in which the movable mass 2 is oscillating at a frequency f in the x axis direction, a Coriolis force in the z axis direction acts on the movable mass 2. The Coriolis force in the z axis direction acting on the movable mass 2 is detected by the third detecting capacitor 17. For example, as shown in FIG. 29, when Coriolis force acts in the z axis negative direction, the movable mass 2 moves in the z axis negative direction. In this case, an increase in electrostatic capacity (+ΔC) is detected by the third detecting capacitor 17. The angular rate $\omega_y$ around the y axis applied to the biaxial angular rate sensor 30 can be measured on the basis of the resulting change in electrostatic capacitance (+ΔC).

The biaxial angular rate sensor 30 of this embodiment can be manufactured e.g., from an SOI substrate and by the manufacturing process described in Embodiment 1. However, the biaxial angular rate sensor 30 does not necessarily have to be manufactured from an SOI substrate, and can instead be formed from a laminate material in which another semiconductor layer besides silicon is laminated via an insulating layer.

Embodiment 10

Figure 30:
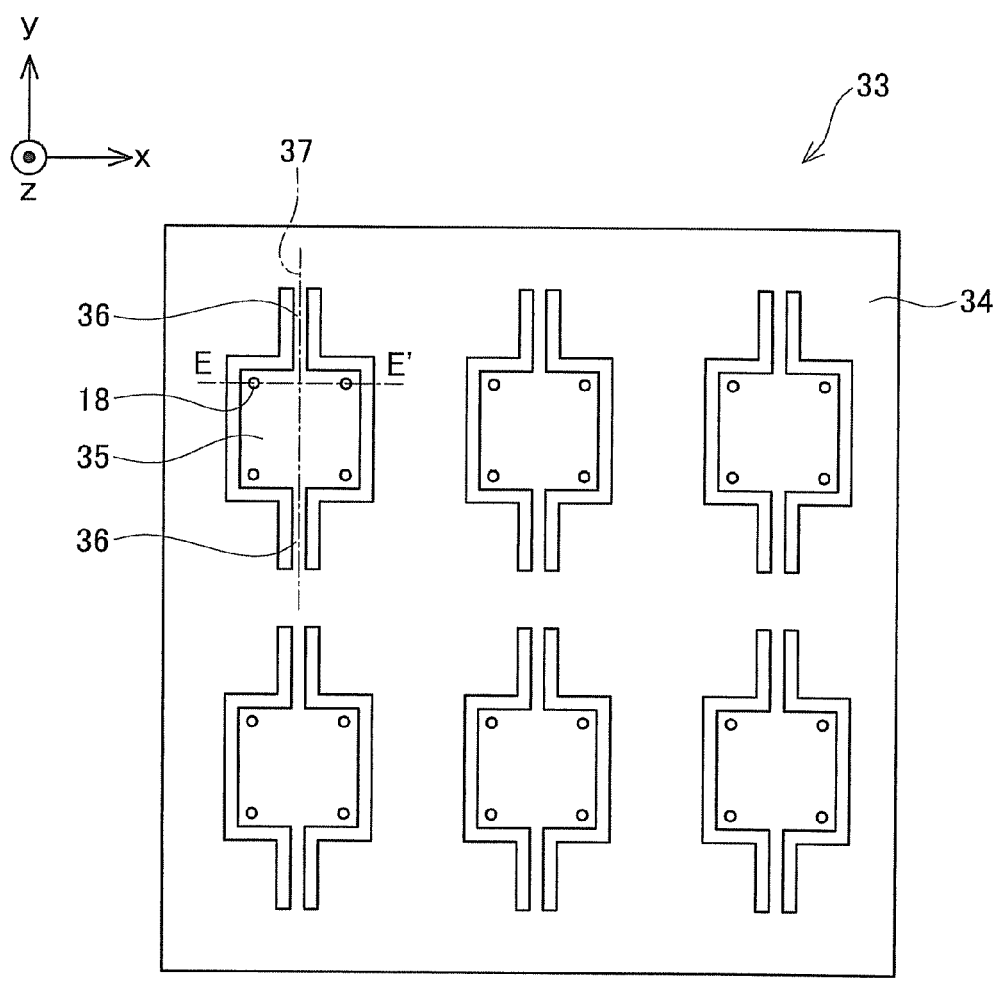
FIG. 30 is a plan view of a mirror array device in Embodiment 10.
Figure 31:
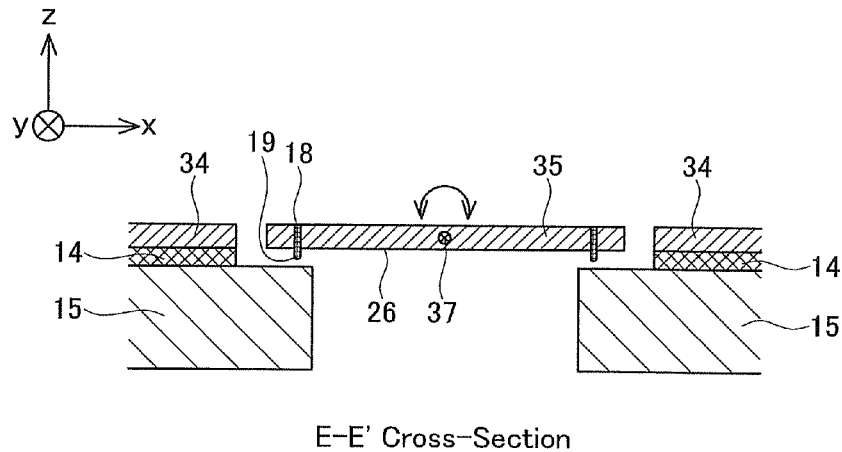
FIG. 31 is an E-E' cross section of the mirror array device shown in FIG. 30.

In Embodiment 10, a Mirror Array Device 33 to which the Present Teachings are applied will be described. FIG. 30 shows the structure of the mirror array device 33 of this embodiment in plan view. FIG. 31 is a cross section of the mirror array device 33 shown in FIG. 30 at the E-E' location. The minor array device 33 is a micro device equipped with microscopic movable mirrors 35.

The mirror array device 33 comprises a support substrate 15 and a mirror substrate 34 supported on the support substrate 15 via an insulating layer 14. The support substrate 15 and the mirror substrate 34 are each fowled by working a bulk substrate of single crystal silicon. The mirror array device 33 can be manufactured, for example, using an SOI substrate.

The mirror substrate 34 is provided with six movable mirrors 35. The six movable mirrors 35 are laid out in a 3×2 matrix. Each of the movable minors 35 is connected to the mirror substrate 34 via a pair of torsion arms 36, and is supported rotatably, with the rotational axis being the center axis 37 of the respective pair of torsion arms 36.

Each of the movable mirrors 35 is provided with protrusions 19 at its four corners. The protrusions 19 are each opposite the support substrate 15. Each of the protrusions 19 is provided with an integrated base portion 18. The base portions 18 extend into the movable mirrors 35 and securely hold the protrusions 19. These protrusions 19 and base portions 18 are constituted as described in Embodiment 2.

With the mirror array device 33, the protrusions 19 are provided as stoppers that limit the rotational angle of the movable mirrors 35. Specifically, when the protrusions 19 hit the support substrate 15, this prohibits excessive rotation of the movable mirrors 35. The movable mirrors 35 and the support substrate 15 collide with the protrusions 19 in between, so there is no direct contact between the two. This prevents the movable mirrors 35 and the support substrate 15 from sticking together.

Each of the protrusions 19 has an integrally molded base portion 18, and is securely fixed to its corresponding movable minor 35. Therefore, even after repeated collisions between the movable mirrors 35 and the support substrate 15 via the protrusions 19, the protrusions 19 are still prevented from coming loose or detaching from the movable minors 35. This prevents the movable mirrors 35 and the support substrate 15 from sticking together over an extended period of time. Furthermore, since the protrusions 19 are prevented from coming loose or detaching, if the protrusions 19 are used to position the movable minors 35, the positioning accuracy can be maintained for an extended period.

Figure 32:
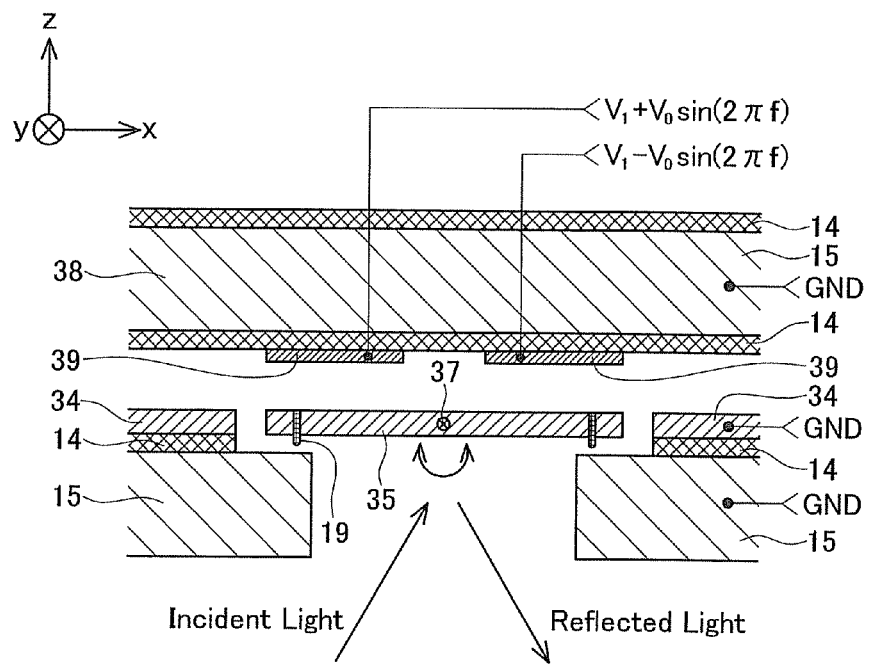
FIG. 32 is a diagram illustrating the method for driving the mirror array device of Embodiment 10.

The method for driving the minor array device 33 will now be described. As shown in FIG. 32, drive of the minor array device 33 is performed by an electrode substrate 38 having mirror driving electrodes 39. The electrode substrate 38 is a silicon substrate covered by insulating layers 14, and the mirror driving electrodes 39 are provided on one of the insulating layers 14. With the electrode substrate 38, a pair of mirror driving electrodes 39 is provided to each of the movable minors 35. As shown in FIG. 32, the electrode substrate 38 is disposed so that each pair of mirror driving electrodes 39 is opposite each movable mirror 35 of the mirror substrate 34. The mirror driving electrodes 39 are formed from a metal material, examples of which may include a single metal material such as aluminum; a mixed material of aluminum, silicon, and copper; a laminate material composed of chromium, nickel, and gold; and a laminate material composed of titanium, platinum, and gold.

As shown in FIG. 32, when the mirror array device 33 is driven, an AC voltage $V_1+V_0 \sin(2\pi f)$ is applied to one of the mirror driving electrodes 39, and an AC voltage $V_1-V_0 \sin(2\pi f)$ is applied to the other mirror driving electrode 39. Also, the mirror substrate 34 and the support substrate 15 are connected to a ground potential. Here, $V_1>V_0$ is assumed. As a result, an electrostatic force is generated between the movable mirrors 35 and the mirror driving electrodes 39, and the movable mirrors 35 are rotationally driven so that the movable mirrors 35 swing at a frequency f around the respective rotational axis 37. If the rotational angle of the movable mirrors 35 becomes large, the protrusions 19 of the movable mirrors 35 hit the support substrate 15, which limits the rotation of the movable mirrors 35. The protrusions 19 thus function as stoppers.

As shown in FIG. 32, light from the outside is radiated on the movable mirrors 35 through an opening in the support substrate 15. The light that is incident on the movable mirrors 35 is reflected by the movable mirrors 35 and sent back to the outside through the opening in the support substrate 15. At this point, a change in the rotational angle of the movable mirrors 35 is accompanied by a change in the angle at which the light is reflected from the movable mirrors 35. The six movable mirrors 35 are each individually rotationally driven.

Specific embodiments of the present teachings are described above, but those merely illustrate some representative possibilities for utilizing the teachings and do not restrict the claims thereof. For example, although the above described Embodiments exemplified plurality of protrusions and base portions, only one set of protrusion and base portion may be utilized. The subject matters set forth in the claims include variations and modifications of the specific examples set forth above.

The technical elements disclosed in the specification or the drawings may be utilized separately or in all types of combinations, and are not limited to the combinations set forth in the claims at the time of filing of the application. Furthermore, the subject matter disclosed herein may be utilized to simultaneously achieve a plurality of objects or to only achieve one object.

What is claimed is:

1. A micro device comprising:
a substrate;
a movable structure configured to move with respect to the substrate;
at least one protrusion being formed on at least one of the substrate and the movable structure and protruding towards the other of the substrate and the movable structure;
a gap interposed between the at least one protrusion and the substrate or between the at least one protrusion and the movable structure; and
at least one base portion being formed integrally with the at least one protrusion and extending into the at least one of the substrate and the movable structure.

2. The micro device as in claim 1, wherein
the substrate and the movable structure each comprises an opposing surface that faces each other across a the gap, and
the at least one protrusion is formed on at least one of the opposing surfaces of the substrate and the movable structure.

3. The micro device as in claim 1, wherein the at least one protrusion includes a curved surface at least at a distal end of the at least one protrusion.

4. The micro device as in claim 1, wherein
the at least one protrusion comprises a bottom surface from which the base portion extends, and
the bottom surface is larger than a cross-section of the base portion and includes a contact region that contacts with a surface of the one of the substrate and the movable structure.

5. The micro device as in claim 4, wherein, in the bottom surface of the at least one protrusion, the contact region surrounds a portion at which the base portion is connected to the at least one protrusion.

6. The micro device as in claim 1, wherein an interface between the base portion and the one of the substrate and the movable structure is at least partly roughened.

7. The micro device as in claim 1, wherein the at least one protrusion and the at least one base portion are made of the same material.

8. The micro device as in claim 1, wherein the at least one protrusion and the at least one base portion are made of polysilicon.

9. The micro device as in claim 1, wherein the substrate is made of a semiconductor material.

10. The micro device as in claim 1, wherein the movable structure is made of a semiconductor material.

11. The micro device as in claim 1, wherein
the substrate and the movable structure each comprises an opposing surface that faces each other across the gap,
the at least one protrusion is formed on at least one of the opposing surfaces of the substrate and the movable structure,
the at least one protrusion comprises a bottom surface from which the base portion extends, and
the bottom surface is larger than a cross-section of the base portion and includes a contact region that contacts with the at least one of the opposing surfaces on which the at least one protrusion is formed.

12. The micro device as in claim 11, wherein, in the bottom surface of the at least one protrusion, the contact region surrounds a portion at which the base portion is connected to the at least one protrusion.

13. The micro device as in claim 12, wherein an interface between the base portion and the one of the substrate and the movable structure is at least partly roughened.

14. The micro device as in claim 13, wherein the at least one protrusion includes a curved surface at least at a distal end of the at least one protrusion.

15. The micro device as in claim 14, wherein the at least one protrusion and the at least one base portion are made of the same material.

16. The micro device as in claim 15, wherein the at least one protrusion and the at least one base portion are made of polysilicon.

17. The micro device as in claim 16, wherein the substrate is made of a semiconductor material.

18. The micro device as in claim 17, wherein the movable structure is made of a semiconductor material.

19. The micro device as in claim 1, further comprising:
a second protrusion formed on the at least one of the substrate and the movable structure, wherein the at least one protrusion is formed with two curved surfaces and the second protrusion is formed with a single curved surface opposite of the at least one protrusion.

20. The micro device as in claim 1, wherein the at least one base portion includes scalloping in the axial direction on the side faces of the at least one base portion.

21. The micro device as in claim 1, wherein the at least one base portion is recessed inward with respect to the upper face of the moveable structure and includes a cavity formed in the at least one base portion.

22. A method for manufacturing a micro device comprising a substrate and a moveable structure configured to move with respect to the substrate, wherein at least one of the substrate and the movable structure comprises at least one protrusion protruding towards the other of the substrate and the movable structure, the method comprising:

preparing a laminate material in which a substrate, a bulk layer and a sacrificial layer disposed between the substrate and the bulk layer are included;

forming at least one hole that reaches the sacrificial layer in one of the substrate and the bulk layer;

etching a part of the sacrificial layer via the at least one hole to form at least one cavity that continues from the at least one hole in the sacrificial layer;

filling the at least one hole and the at least one cavity with a material of the protrusion;

working the bulk layer into the shape of the movable structure; and etching the sacrificial layer that is remaining between the substrate and the movable structure to form a gap between the at least one protrusion and the substrate or between the at least one protrusion and the movable structure.

23. The method as in claim 22, wherein the at least one cavity is formed by isotropic etching of the sacrificial layer.

* * * * *